(12) United States Patent
Ito et al.

(10) Patent No.: US 6,518,864 B1
(45) Date of Patent: Feb. 11, 2003

(54) COPLANAR TRANSMISSION LINE

(75) Inventors: Masaharu Ito, Tokyo (JP); Kenichi Maruhashi, Tokyo (JP); Keiichi Ohata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/525,986

(22) Filed: Mar. 15, 2000

(30) Foreign Application Priority Data

Mar. 15, 1999 (JP) .......................................... 11-069177

(51) Int. Cl.⁷ ................................................ H01P 3/08
(52) U.S. Cl. ........................................ 333/238; 333/246
(58) Field of Search .................................. 333/238, 246

(56) References Cited

U.S. PATENT DOCUMENTS 5,739,560 A * 4/1998 Toyoda et al. ............... 257/211
5,923,234 A * 7/1999 Holzman et al. ............ 333/238
6,178,311 B1 * 1/2001 Pance et al. .................... 455/78

FOREIGN PATENT DOCUMENTS

JP          9-23106       1/1997       ............. H01P/3/02

OTHER PUBLICATIONS

Japanese Office Action dated May 29, 2001 (13 5 29), pp. 1 and 2, No. 154740, Examiner's Comments encompassed by hand–written waived lines (English translation attached of waived lines–only).

* cited by examiner

Primary Examiner—Robert Pascal
Assistant Examiner—Joseph Chang
(74) Attorney, Agent, or Firm—Michael Best & Friedrich LLC

(57) ABSTRACT

The present invention provides a transmission line structure comprising: a dielectric substrate having first and second surfaces; a signal conductive layer selectively provided on the first surface of the dialectic substrate for signal transmission; at least a first non-signal conductive layer being selectively provided on the first surface of the dialectic substrate, and the at least first non-signal conductive layer being separated from the signal conductive layer; and a second non-signal conductive layer being provided on the second surface of the dialectic substrate, wherein the dielectric substrate has at least a conductive region extending in contact with only one of the at least first non-signal conductive layer and the second non-signal conductive layer so that the at least conductive region is separated by the dielectric substrate from remaining one of the first non-signal conductive layers and the second non-signal conductive layer in view of a vertical direction to the first and second surfaces of the dielectric substrate.

13 Claims, 24 Drawing Sheets

COPLANAR TRANSMISSION LINE

BACKGROUND OF THE INVENTION

The present invention relates to a coplanar transmission line, and more particularly to a coplanar transmission line used in a high frequency circuit, wherein the coplanar transmission line is improved in reduction of a transmission loss and also in keeping a sufficient chemical strength.

The coplanar transmission line has been used in the high frequency circuit. The coplanar transmission line has the following structure. A signal conductive layer is selectively formed on a surface of a dielectric substrate, wherein the signal conductive layer allows a signal transmission. Ground conductive layers are selectively formed on the top surface of the dielectric substrate, so that the ground conductive layers extend along opposite sides of the signal conductive layer. A bottom ground conductive layer is formed on a bottom surface of the dielectric substrate for mounting the substrate to an external case, wherein the bottom ground conductive may be made of a metal such as gold or tin. The ground conductive layers on the top surface of the dielectric substrate and the bottom ground conductive layer on the bottom surface of the dielectric substrate do form a parallel-plate structure which allows a parallel-plate mode signal as a leakage signal to be propagated through the dielectric substrate and in a direction perpendicular to a signal transmission direction in which the signal is transmitted in the signal conductive layer or the co-planer transmission line. As a frequency of the signal transmitted or propagated through the coplanar transmission line is high, a signal waveguide mode is coupled to the parallel-plate mode, whereby the signal transmission loss is increased. Further, even if a distance between adjacent two of the coplanar transmission lines is large, the signal waveguide mode is made coupled to the parallel-plate mode whereby coupling of the signal waveguide mode between the adjacent two of the coplanar transmission lines appears through the parallel-plate mode. Namely, it is difficult for the conventional structure of the coplanar transmission line to prevent the signal transmission loss due to the coupling in the parallel-plate mode between the adjacent two of the coplanar transmission lines.

In order to have solved the above problem with the signal transmission loss due to the coupling between the adjacent two of the coplanar transmission lines, another conventional structure of the coplanar transmission line has been proposed, which is disclosed in Nirod K. Das "IEEE Transactions on Microwave Theory and Techniques", Vol. 44, pp. 169–181, 1996. This conventional structure of the coplanar transmission line has a plurality of metal via which provide connections between the ground conductive layers on the top surface of the dielectric substrate and the bottom ground conductive layer on the bottom surface of the dialectic substrate. FIG. 1 is a fragmentary cross sectional elevation view illustrative of the conventional structure of the coplanar transmission line, wherein the plurality of metal via is provided for providing connections between the ground conductive layers on the top surface of the dielectric substrate and the bottom ground conductive layer on the bottom surface of the dialectic substrate.

A signal conductive layer 22 is selectively formed on a top surface of a dielectric substrate 21 which is made of a ceramic. Two ground conductive layers 23 are selectively formed on the top surface of the dielectric substrate 21, so that the ground conductive layers 23 extend in opposite sides of the signal conductive layer 22, provided that the ground conductive layers 23 are distanced from opposite side edges of the signal conductive layer 22. A bottom ground conductive layer 24 is formed entirely on a bottom surface of the dielectric substrate 21. Two metal vias 25 are formed in the dielectric substrate 21 so that the two ground conductive layers 23 are connected through the two metal vias 25 to the bottom ground conductive layer 24. The metal vias 25 may prevent the signal or power leakage in the parallel-plate mode.

Still another conventional structure of the coplanar transmission line is disclosed in M. Hotta Asia Pacific Microwave Conference 1998 Proceedings, pp. 409–412. FIG. 2 is a fragmentary cross sectional elevation view illustrative of the still other conventional structure of the coplanar transmission line, wherein a groove is formed. A groove is formed in the dielectric substrate, so that the groove extends under the signal conductive layer and over the bottom ground conductive layer. A signal conductive layer 32 is selectively formed on a top surface of a dielectric substrate 31. Two ground conductive layers 33 are selectively formed on the top surface of the dielectric substrate 31, so that the ground conductive layers 33 extend in opposite sides of the signal conductive layer 32, provided that the ground conductive layers 33 are distanced from opposite side edges of the signal conductive layer 32. A bottom ground conductive layer 34 is formed entirely on a bottom surface of the dielectric substrate 31. A groove 36 is formed in the dielectric substrate 31, so that a bottom of the groove 36 is positioned directly over the bottom ground conductive layer 34, whilst a top of the groove 36 is positioned indirectly under the signal conductive layer 32 and also under inside portions of the ground conductive layers 33, provided that the top of the groove 36 is separated by a part of the dielectric substrate 31 from the signal conductive layer 32 and the ground conductive layers 33. The existence of the groove 36 makes a reduction in thickness of the part of the dielectric substrate 31 under the signal conductive layer 32, whereby the signal or power leakage in the parallel-plate mode is cut off.

Yet another conventional structure of the coplanar transmission line is disclosed in Japanese Laid-open Patent Publication No. 9-23106. A signal conductive layer is selectively formed on a top surface of a dielectric substrate. Two ground conductive layers are selectively formed on the top surface of the dielectric substrate, so that the ground conductive layers extend in opposite sides of the signal conductive layer, provided that the ground conductive layers are distanced from opposite side edges of the signal conductive layer. A bottom ground conductive layer is formed entirely on a bottom surface of the dielectric substrate. Two metal vias are formed in the dielectric substrate so that the two ground conductive layers are connected through the two metal vias to the bottom ground conductive layer. The metal vias may prevent the signal or power leakage in the parallel-plate mode. Additionally, four recessed portions are formed in opposite edges of the dielectric substrate, wherein the opposite edges are distanced in the same direction as the signal transmission or signal propagation through the signal conductive layer. At the opposite edges of the dielectric substrate, a discontinuity in the transmission or propagation mode is likely to appear. The recessed portions suppress generation of the higher-order propagation mode.

An additional conventional structure of the coplanar transmission line is disclosed in Japanese Laid-open Patent Publication No. 9-23107. A signal conductive layer is selectively formed on a top surface of a dielectric substrate. Two ground conductive layers are selectively formed on the top surface of the dielectric substrate, so that the ground conductive layers extend in opposite sides of the signal conductive layer, provided that the ground conductive layers are distanced from opposite side edges of the signal conductive layer. A bottom ground conductive layer is formed entirely on a bottom surface of the dielectric substrate. Two metal vias are formed in the dielectric substrate so that the two ground conductive layers are connected through the two metal vias to the bottom ground conductive layer. The metal vias may prevent the signal or power leakage in the parallel-plate mode. Additionally, a shielding ground conductive cover is provided which covers the inside portions of the two ground conductive layers and the signal conductive layer, wherein the shielding ground conductive cover is in contact with the two ground conductive layers. Furthermore, a connecting side of the dielectric substrate which is to be connected with a co-axial connector is modified in shape of the two ground conductive layers on the top surface of the dielectric substrate. At the connecting side, the two ground conductive layers are made distanced from the signal conductive layer. Namely, the distance of the two ground conductive layers from the signal conductive layer is increased at the connecting side for improvement in impedance-matching at the connecting side which is to be connected with the co-axial connector.

The above described conventional structures of the coplanar transmission lines have individual disadvantages as follows.

The conventional structure of the coplanar transmission line illustrated in FIG. 1 has a number of the metal via for suppressing the signal or power leakage to the parallel-plate mode, whereby this structure causes a problem that the dielectric substrate is insufficient in mechanical strength and thermal-stress stability.

If the conventional structure of the coplanar transmission line having a plurality of via is applied to a sealed package, a problem is caused in a possible leakage of air from the bottom surface of the dielectric substrate. FIG. 3 is a schematic perspective view illustrative of a sealed package for the conventional structure of the coplanar transmission line having a plurality of via. A first multi-layer dielectric substrate 21a has a top surface on which a signal conductive layer 22a and two ground conductive layers 23a are formed, so that the two ground conductive layers 23a extend in opposite sides of the signal conductive layer 22a and also the two ground conductive layers 23a are separated from the signal conductive layer 22a. A plurality of via 25a is formed which penetrates through the first multi-layer dielectric substrate 21a. The plurality of via 25a are aligned along inside edges of the two ground conductive layers 23a. A semiconductor device 27 is mounted on a center portion of the first multi-layer dielectric substrate 21a, so that a bottom surface of the semiconductor device 27 is in contact with the signal conductive layer 22a and the inside portions of the two ground conductive layers 23a. A second multi-layer dielectric substrate 21b is provided on the top surface of the first multi-layer dielectric substrate 21a. The second multi-layer dielectric substrate 21b has a large square-shaped opening in which the semiconductor device 27 is accommodated. A size of the square-shaped opening is much larger than the semiconductor device 27, so that the inside edges of the second multi-layer dielectric substrate 21b is separated from the semiconductor device 27. The second multi-layer dielectric substrate 21b is thicker than the semiconductor device 27. A top cover 26 is provided on the top surface of the second multi-layer dielectric substrate 21b, wherein the top cover 26 has substantially the same size as the second multi-layer dielectric substrate 21b, so that the semiconductor device 27 is accommodated within an internal space defined by the top cover 26, the second multilayer dielectric substrate 21b and the first multi-layer dielectric substrate 21a. This packaging structure allows a possible leakage of air from the bottom surface of the first multi-layer dielectric substrate 21a.

The conventional structure of the coplanar transmission line illustrated in FIG. 2 has the groove so provided that the thickness of the part of the dielectric substrate under the signal conductive layer and over the groove is reduced, whereby this structure causes a problem that the dielectric substrate is insufficient in mechanical strength.

The conventional structure of the coplanar transmission line disclosed in Japanese Laid-open Patent Publication No. 9-23106 has a number of the metal via for suppressing the signal or power leakage to the parallel-plate mode, whereby this structure causes a problem that the dielectric substrate is insufficient in mechanical strength and thermal-stress stability.

The conventional structure of the coplanar transmission line disclosed in Japanese Laid-open Patent Publication No. 9-23107 also has a number of the metal via for suppressing the signal or power leakage to the parallel-plate mode, whereby this structure causes a problem that the dielectric substrate is insufficient in mechanical strength and thermal-stress stability.

In the above circumstances, it had been required to develop a novel coplanar transmission line structure free from the above problems.

SUMMARY OF THE INVENTION

Accordingly, it is an object of the present invention to provide a novel coplanar transmission line structure free from the above problems.

It is a further object of the present invention to provide a novel coplanar transmission line structure which reduces a transmission loss.

It is a still further object of the present invention to provide a novel coplanar transmission line structure which allows a dielectric substrate to have a high mechanical strength.

It is yet a further object of the present invention to provide a novel coplanar transmission line structure which allows a dielectric substrate to have a high thermal stress stability.

The first present invention provides a transmission line structure comprising: a dielectric substrate having first and second surfaces; a signal conductive layer selectively provided on the first surface of the dialectic substrate for signal transmission; at least a first non-signal conductive layer being selectively provided on the first surface of the dialectic substrate, and the at least first non-signal conductive layer being separated from the signal conductive layer and a second non-signal conductive layer being provided on the second surface of the dialectic substrate, wherein the dielectric substrate has at least a conductive region extending in contact with only one of the at least first non-signal conductive layer and the second non-signal conductive layer so that the at least conductive region is separated by the dielectric substrate from remaining one of the first non-signal conductive layers and the second non-signal conductive layer in view of a vertical direction to the first and second surfaces of the dielectric substrate.

The second present invention provides a transmission line structure comprising: a dielectric substrate having first and second surfaces; a signal conductive layer selectively provided on the first surface of the dialectic substrate for signal transmission; at least a first non-signal conductive layer being selectively provided on the first surface of the dialectic substrate, and the at least first non-signal conductive layer being separated from the signal conductive layer; and a second non-signal conductive layer being provided on the second surface of the dialectic substrate, wherein the dielectric substrate has at least a low dielectric constant region which is lower in dielectric constant than the dielectric substrate and which does at least extend under a part of the first non-signal conductive layer near the signal conductive layer, whereby there is reduced an effective dielectric constant of the dielectric substrate receiving a field generated from the signal on transmission through the signal conductive line, so that the transmission loss is reduced.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
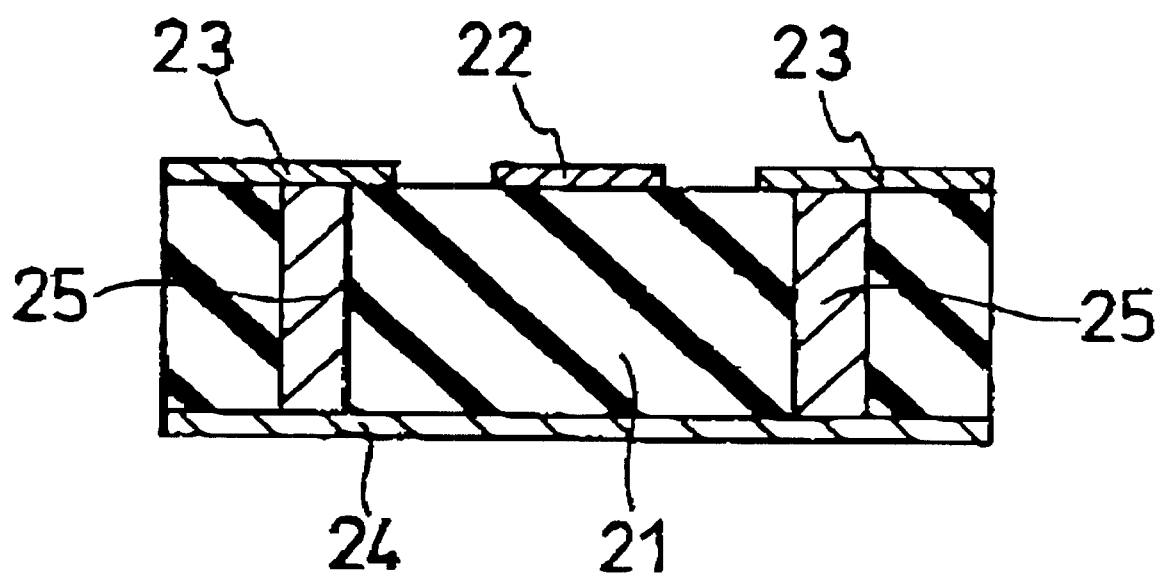
FIG. 1 is a fragmentary cross sectional elevation view illustrative of the conventional structure of the coplanar transmission line, wherein the plurality of metal via is provided for providing connections between the ground conductive layers on the top surface of the dielectric substrate and the bottom ground conductive layer on the bottom surface of the dialectic substrate.
Figure 2:
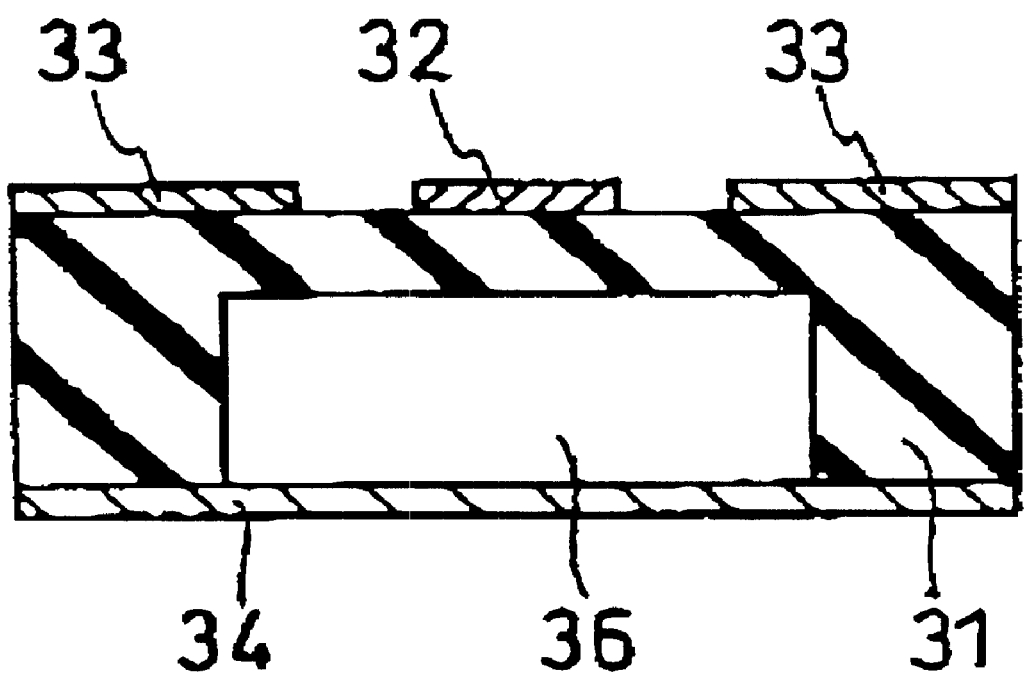
FIG. 2 is a fragmentary cross sectional elevation view illustrative of the still other conventional structure of the coplanar transmission line, wherein a groove is formed.
Figure 3:
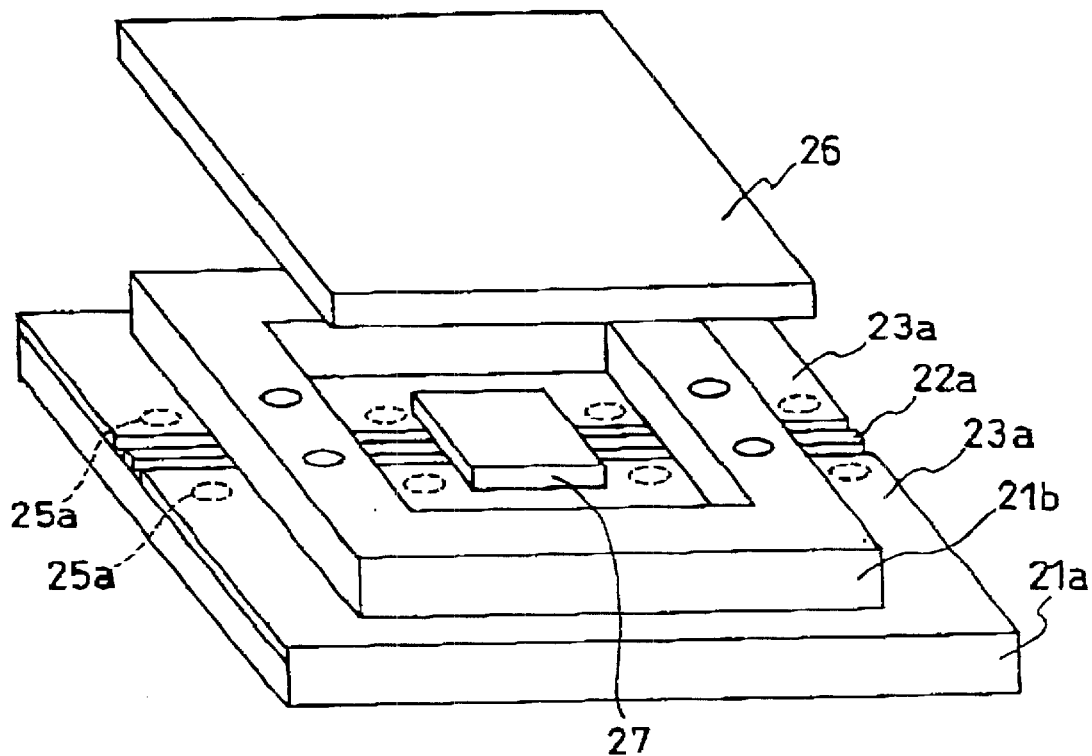
FIG. 3 is a schematic perspective view illustrative of a sealed package for the conventional structure of the coplanar transmission line having a plurality of via.

The first present invention provides a transmission line structure comprising: a dielectric substrate having first and second surfaces; a signal conductive layer selectively provided on the first surface of the dialectic substrate for signal transmission; at least a first non-signal conductive layer being selectively provided on the first surface of the dialectic substrate, and the at least first non-signal conductive layer being separated from the signal conductive layer; and a second non-signal conductive layer being provided on the second surface of the dialectic substrate, wherein the dielectric substrate has at least a conductive region extending in contact with only one of the at least first non-signal conductive layer and the second non-signal conductive layer so that the at least conductive region is separated by the dielectric substrate from remaining one of the first non-signal conductive layers and the second non-signal conductive layer in view of a vertical direction to the first and second surfaces of the dielectric substrate.

The first and second non-signal conductive layers may be substantially fixed in potential. The first and second non-signal conductive layers may comprise ground conductive layers which are grounded.

The conductive region extending in the vertical direction to the first and second surfaces of the dielectric substrate suppresses coupling between the signal waveguide mode and the parallel-plate mode, whereby the transmission loss can be prevented.

Further, the conductive region is in contact with only one of the first non-signal conductive layer and the second non-signal conductive layer, so that the conductive region is separated by the dielectric substrate from remaining one of the first non-signal conductive layers and the second non-signal conductive layer in view of the vertical direction to the first and second surfaces of the dielectric substrate. Namely, the conductive region does not penetrate the dielectric substrate in view of the vertical direction to the first and second surfaces of the dielectric substrate, whereby the dielectric substrate has a high mechanical strength and a high thermal stress stability.

Furthermore, the conductive region does not penetrate the dielectric substrate. This means that no penetrating hole is formed, whereby it is possible to keep a high sealing effect for package in multi-layer substrate.

It is preferable that the conductive region does at least extend under a part of the first non-signal conductive layer near the signal conductive layer, so that the effect of suppression to the coupling between the signal waveguide mode and the parallel-plate mode can be improved.

It is also preferable that the conductive region continuously extends along a direction of signal propagation through the signal conductive layer. The effect of the suppression to the coupling between the signal waveguide mode and the parallel-plate mode is superior than when the conductive region discontinuously extends. It is possible that the conductive region comprises a continuous groove-shaped region.

It is also preferable that the conductive region discontinuously extends along a direction of signal propagation through the signal conductive layer. The effect of improvements in mechanical strength and thermal stress stability is superior than when the conductive region continuously extends. It is necessary that a distance of discontinuation of the conductive region in the direction of signal propagation is not more than one half of a wavelength of signal to be transmitted through the signal conductive line, so that the signal wave on transmission through the signal conductive layer can sense the conductive region almost continuously. If the distance of discontinuation of the conductive region in the direction of signal propagation is more than one half of a wavelength of signal to be transmitted through the signal conductive line, so that the signal wave on transmission through the signal conductive layer can not sense the conductive region almost continuously, whereby it is possible that the signal waveguide mode may be coupled to the parallel-plate mode.

In the above case, it is possible that the conductive region comprises at least an alignment of a plurality of conductive via. Each of the conductive via may have a pin-shape.

It is also possible that the conductive region comprises a single alignment of a plurality of conductive via which is in contact with the first non-signal conductive layer, and which is separated by the dielectric substrate from the second non-signal conductive layer.

It is also possible that the conductive region comprises a single alignment of a plurality of conductive via which is in contact with the second non-signal conductive layer, and which is separated by the dielectric substrate from the first non-signal conductive layer.

It is also possible that the conductive region comprises a single alignment which further comprises a top sub-alignment of a plurality of top conductive via which is in contact with the first non-signal conductive layer and which is separated by the dielectric substrate from the second non-signal conductive layer, and a bottom sub-alignment of a plurality of bottom conductive via which is in contact with the second non-signal conductive layer and which is separated by the dielectric substrate from the first non-signal conductive layer. The plurality of top conductive via and the plurality of bottom conductive via may be connected through an interlayer conductive layer, so that an electrical connection is formed between the first non-signal conductive layer and the second non-signal conductive layer through the top conductive via and the bottom conductive via, whereby the effect of suppression to the coupling between the signal waveguide mode and the parallel-plate mode is further increased. Further, the plurality of top conductive via and the plurality of bottom conductive via are displaced from each other in the direction of the signal propagation in order to keep the high mechanical strength and the high thermal stress stability.

It is also possible that the conductive region comprises dual alignments, each of which further comprises a top sub-alignment of a plurality of top conductive via which is in contact with the first non-signal conductive layer and which is separated by the dielectric substrate from the second non-signal conductive layer, and a bottom sub-alignment of a plurality of bottom conductive via which is in contact with the second non-signal conductive layer and which is separated by the dielectric substrate from the first non-signal conductive layer. The plurality of top conductive via and the plurality of bottom conductive via may be connected through an inter-layer conductive layer, so that an electrical connection is formed between the first non-signal conductive layer and the second non-signal conductive layer through the top conductive via and the bottom conductive via, whereby the effect of suppression to the coupling between the signal waveguide mode and the parallel-plate mode is further increased. Further, the plurality of top conductive via and the plurality of bottom conductive via are displaced from each other in the direction of the signal propagation in order to keep the high mechanical strength and the high thermal stress stability.

It is preferable that the conductive region has a size in the vertical direction in a range of $1/5$ to $3/5$ of a thickness of the dielectric substrate. The size in the vertical direction of the conductive region corresponds to the height or thickness of the conductive region. Preferable range in size in the vertical direction of the conductive region depends upon various conductions such as the frequency of the signal and the thickness of the dielectric substrate. If the height or thickness of the conductive region is decreased, then the effect of suppression to the coupling between the signal waveguide mode and the parallel-plate mode is decreased, whilst the effects of improvements in mechanical strength and thermal stress stability of the dielectric substrate is increased. If the height or thickness of the conductive region is increased, then the effect of suppression to the coupling between the signal waveguide mode and the parallel-plate mode is increased, whilst the effects of improvements in mechanical strength and thermal stress stability of the dielectric substrate is decreased. It is more preferable that the size is in a range of ½ to ⅗ of a thickness of the dielectric substrate.

It is possible that two of the first non-signal conductive layer are provided in opposite sides of the signal conductive line to form a co-planar structure, and at least two of the conductive region extend at least under portions of two of the first non-signal conductive layer near the signal conductive layer. Namely, the above novel structure may be applicable to the coplanar transmission line.

It is also possible that one of the first non-signal conductive layer is provided to form a slot structure, and the conductive region does at least extend under the first non-signal conductive layer near the signal conductive layer. Namely, the above novel structure may be applicable to the slot transmission line.

It is further possible to provide at least a low dielectric constant region which is lower in dielectric constant than the dielectric substrate, and the low dielectric constant region extends in the dielectric substrate, whereby there is reduced an effective dielectric constant of the dielectric substrate receiving a field generated from the signal on transmission through the signal conductive line, so that the transmission loss is reduced. In this case, the both effects provided by the low dielectric constant region and the conductive region can be obtained.

The second present invention provides a transmission line structure comprising: a dielectric substrate having first and second surfaces; a signal conductive layer selectively provided on the first surface of the dialectic substrate for signal transmission; at least a first non-signal conductive layer being selectively provided on the first surface of the dialectic substrate, and the at least first non-signal conductive layer being separated from the signal conductive layer; and a second non-signal conductive layer being provided on the second surface of the dialectic substrate, wherein the dielectric substrate has at least a low dielectric constant region which is lower in dielectric constant than the dielectric substrate and which does at least extend under a part of the first non-signal conductive layer near the signal conductive layer, whereby there is reduced an effective dielectric constant of the dielectric substrate receiving a field generated from the signal on transmission through the signal conductive line, so that the transmission loss is reduced.

The first and second non-signal conductive layers may be substantially fixed in potential. The first and second non-signal conductive layers may comprise ground conductive layers which are grounded.

Furthermore, the conductive region does not penetrate the dielectric substrate. This means that no penetrating hole is formed, whereby it is possible to keep a high sealing effect for package in multi-layer substrate.

It is preferable that the low dielectric constant region comprises a solid-state dielectric material lower in dielectric constant than the dielectric substrate, whereby the improvements in mechanical strength and thermal stress stability can be obtained.

It is also preferable that the low dielectric constant region comprises an air-containing region, for example, a cavity containing an air. The air is lower in dielectric constant than the other solid-state dielectric material. This structure causes further improvements in mechanical strength and thermal stress stability.

It is also possible that the low dielectric constant region is separated by the dielectric substrate from both the first non-signal conductive layer and the second non-signal conductive layer.

It is also possible that the low dielectric constant region extends in contact with only one of the at least first non-signal conductive layer and the second non-signal conductive layer so that the at least conductive region is separated by the dielectric substrate from remaining one of the first non-signal conductive layers and the second non-signal conductive layer in view of a vertical direction to the first and second surfaces of the dielectric substrate.

It is also possible that the at least low dielectric constant region continuously extends along a direction of signal propagation through the signal conductive layer. The effect of the suppression to the coupling between the signal waveguide mode and the parallel-plate mode is superior than when the conductive region discontinuously extends. The low dielectric constant region may comprise a continuous groove-shaped region.

It is also possible that the low dielectric constant region discontinuously extends along a direction of signal propagation through the signal conductive layer. The effect of improvements in mechanical strength and thermal stress stability is superior than when the conductive region continuously extends. It is necessary that a distance of discontinuation of the low dielectric constant region in the direction of signal propagation is not more than one half of a wavelength of signal to be transmitted through the signal conductive line, so that the signal wave on transmission through the signal conductive layer can sense the low dielectric constant region almost continuously. If the distance of discontinuation of the low dielectric constant region in the direction of signal propagation is more than one half of a wavelength of signal to be transmitted through the signal conductive line, so that the signal wave on transmission through the signal conductive layer can not sense the low dielectric constant region almost continuously, whereby it is possible that the signal waveguide mode may be coupled to the parallel-plate mode. In this case, it is possible that the low dielectric constant region comprises a plurality of holes distributed under the signal conductive layer and at least a part of the non-signal conductive layer near the signal conductive layer.

It is further important that a subtraction of a height in said vertical direction of the low dielectric constant region from a thickness of said dielectric substrate is less than a value of $c/\{4f(\in_r-1)^{1/2}\}$, where "c" is the speed of light, "f" is the frequency of signal, and "$\in_r$" is the dielectric constant of the dielectric substrate. If the height or thickness of the low dielectric constant region is decreased, then the effect of suppression to the transmission loss is decreased, whilst the effects of improvements in mechanical strength and thermal stress stability of the dielectric substrate is increased. If the height or thickness of the low dielectric constant region is increased, then the effect of suppression to the transmission is increased, whilst the effects of improvements in mechanical strength and thermal stress stability of the dielectric substrate is decreased. Preferable range of the height or thickness of the low dielectric constant region depend upon the frequency of the signal and the dielectric constant of the dielectric substrate, for which reason the height or thickness of the low dielectric constant region is preferably decided so that a subtraction of a height in said vertical direction of the low dielectric constant region from a thickness of said dielectric substrate is less than a value of $c/\{4f(\in_r-1)^{1/2}\}$.

It is possible that two of the first non-signal conductive layer are provided in opposite sides of the signal conductive line to form a co-planar structure, and at least two of the low dielectric constant region extend at least under portions of two of the first non-signal conductive layer near the signal conductive layer. Namely, the above structure may be applicable to the co-planar structure.

It is possible that one of the first non-signal conductive layer is provided to form a slot structure, and the low dielectric constant region does at least extend under a part of the first non-signal conductive layer near the signal conductive layer. Namely, the above structure may be applicable to the slot structure.

It is possible to further provide at least a conductive region extending in the dielectric substrate so as to be in contact with only one of the at least first non-signal conductive layer and the second non-signal conductive layer so that the at least conductive region is separated by the dielectric substrate from remaining one of the first non-signal conductive layers and the second non-signal conductive layer in view of a vertical direction to the first and second surfaces of the dielectric substrate. The conductive region extending in the vertical direction to the first and second surfaces of the dielectric substrate suppresses coupling between the signal waveguide mode and the parallel-plate mode, whereby the transmission loss can be prevented.

Further, the conductive region is in contact with only one of the first non-signal conductive layer and the second non-signal conductive layer, so that the conductive region is separated by the dielectric substrate from remaining one of the first non-signal conductive layers and the second non-signal conductive layer in view of the vertical direction to the first and second surfaces of the dielectric substrate. Namely, the conductive region does not penetrate the dielectric substrate in view of the vertical direction to the first and second surfaces of the dielectric substrate, whereby the dielectric substrate has a high mechanical strength and a high thermal stress stability.

Furthermore, the conductive region does not penetrate the dielectric substrate. This means that no penetrating hole is formed, whereby it is possible to keep a high sealing effect for package in multi-layer substrate.

In this case, the both effects provided by the low dielectric constant region and the conductive region can be obtained.

PREFERRED EMBODIMENT

First Embodiment

Figure 4A:
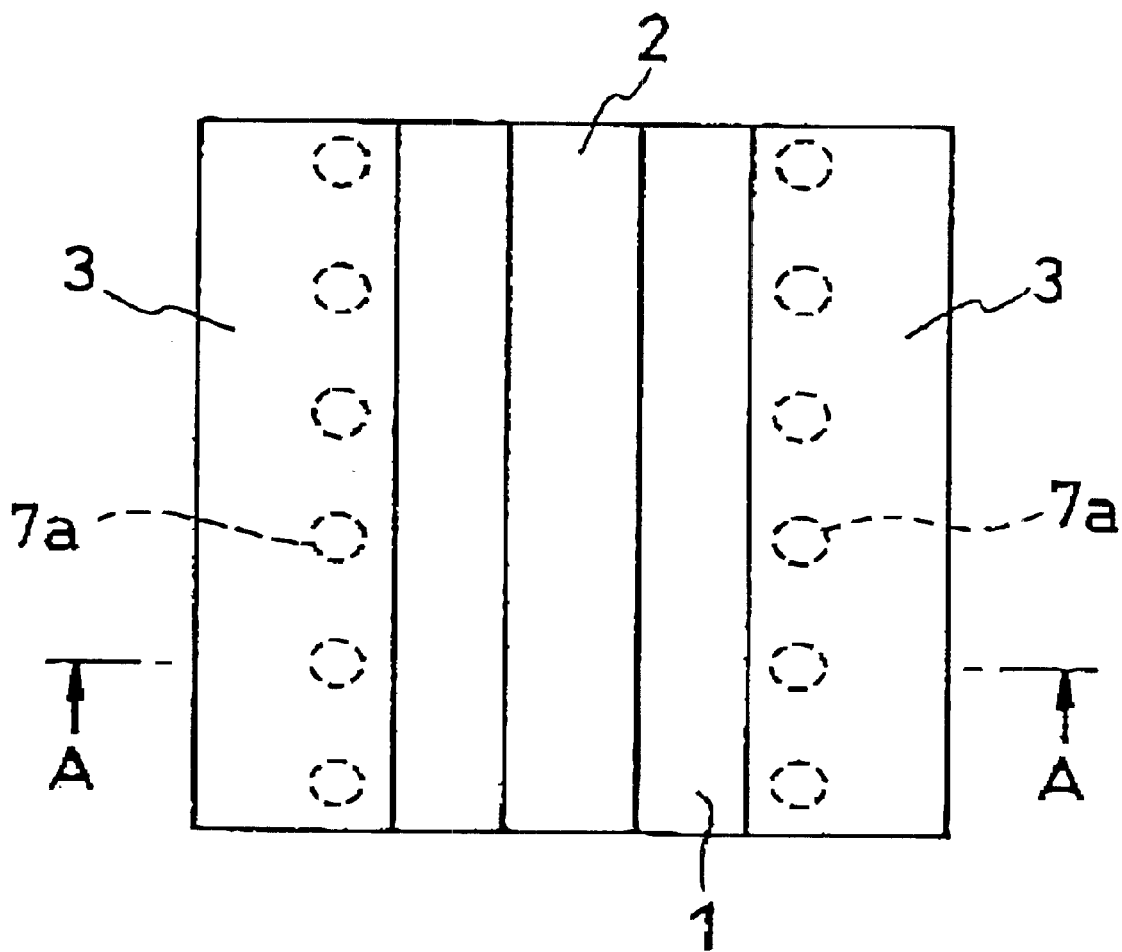
FIG. 4A is a fragmentary plane view illustrative of a novel structure of a co-planer transmission line in a first embodiment in accordance with the present invention.
Figure 4B:
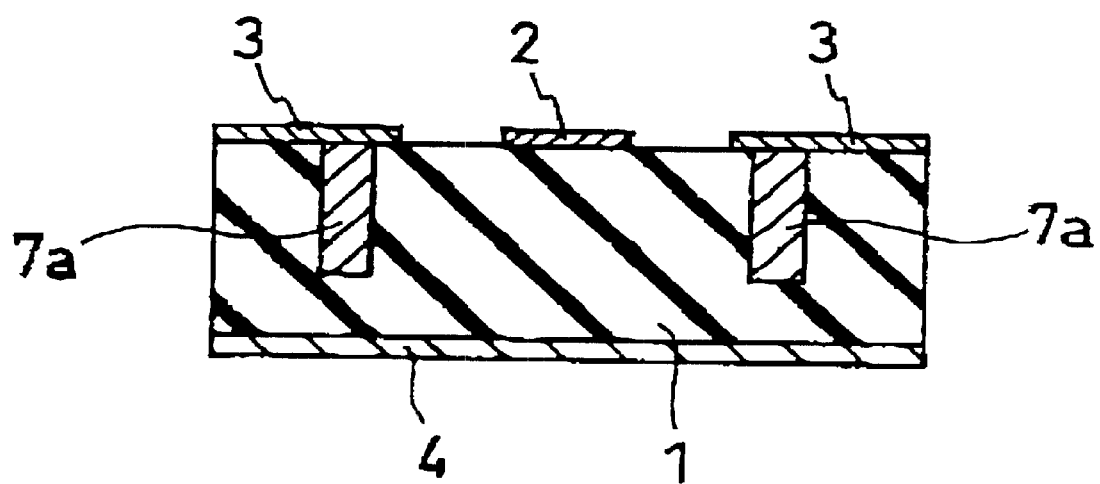
FIG. 4B is a fragmentary cross sectional elevation view taken along an A—A line of FIG. 4A and is illustrative of a novel structure of a co-planer transmission line in a first embodiment in accordance with the present invention.

A first embodiment according to the present invention will be described in detail with reference to the drawings. FIG. 4A is a fragmentary plane view illustrative of a novel structure of a co-planer transmission line in a first embodiment in accordance with the present invention. FIG. 4B is a fragmentary cross sectional elevation view taken along an A—A line of FIG. 4A and is illustrative of a novel structure of a co-planer transmission line in a first embodiment in accordance with the present invention.

A signal conductive layer 2 as a co-planer transmission line is selectively formed on a top surface of a dielectric substrate 1 which is made of a ceramic. Two ground conductive layers 3 are selectively formed on the top surface of the dielectric substrate 1, so that the ground conductive layers 3 extend in opposite sides of the signal conductive layer 2, provided that the ground conductive layers 3 are distanced from opposite side edges of the signal conductive layer 2. A bottom ground conductive layer 4 is formed entirely on a bottom surface of the dielectric substrate 1. The ground conductive layers 3 and the bottom ground conductive layer 4 are grounded to be substantially fixed at ground potential.

A pair of first and second single alignments of conductive pins 7a is provided in a longitudinal direction of the signal conductive layer 2, wherein signals are propagated in the longitudinal direction. The conductive pins 7a extend in the dielectric substrate 1. The conductive pins 7a extend under inside parts of the ground conductive layers 3 near the signal conductive layer 2. The top portions of the conductive pins 7a are in contact directly with the ground conductive layers 3, whilst the bottom portions of the conductive pins 7a are separated by the dielectric substrate 1 from the bottom ground conductive layer 4. The conductive pins 7a have a predetermined uniform bottom level which is higher than the bottom ground conductive layer 4. The conductive pins 7a are aligned at a constant pitch which is less than one half of a wavelength of the signal to be transmitted through the signal conductive layer 2, so that the signal wave can sense the conductive pins 7a.

Figure 11:
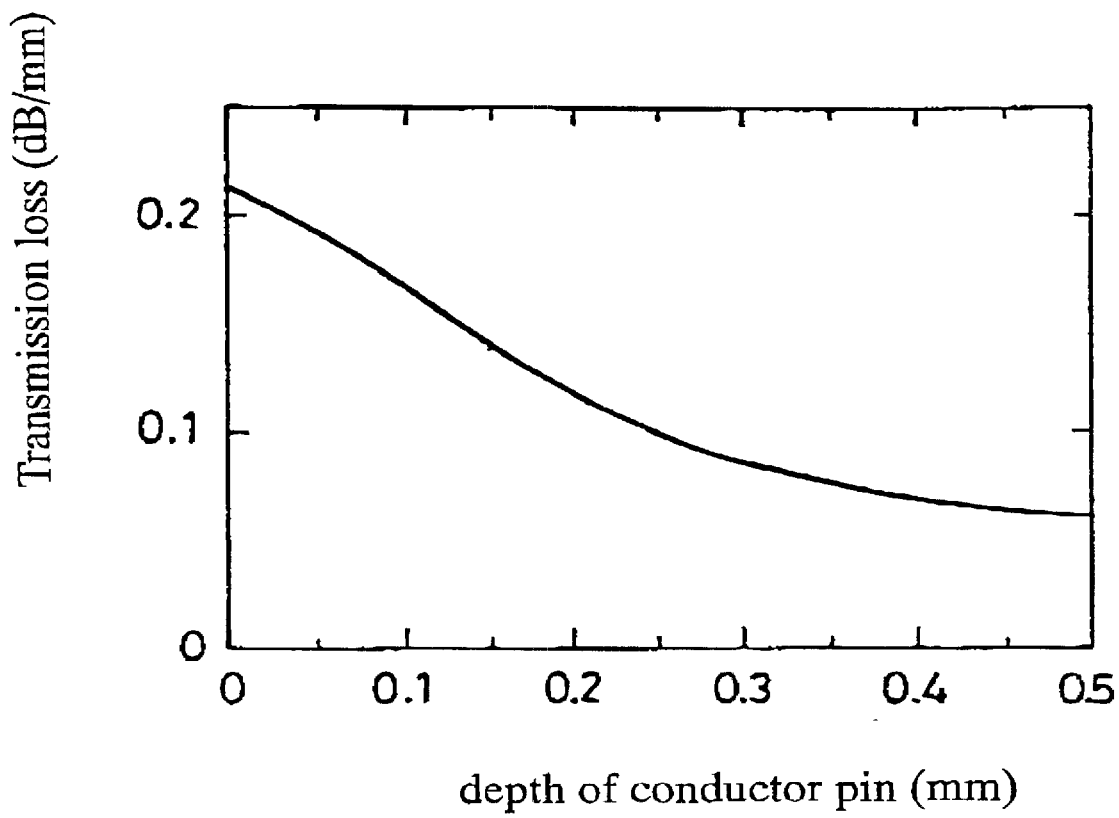
FIG. 11 is a diagram illustrative of variation in transmission loss over a depth of the conductive pins where a thickness of the dielectric substrate is 0.5 mm and a frequency of the signal is 60 GHz.

FIG. 11 is a diagram illustrative of variation in transmission loss over a depth of the conductive pins where a thickness of the dielectric substrate is 0.5 mm and a frequency of the signal is 60 GHz. As the depth of the conductive pins 7a is increased, the transmission loss is decreased. A gradient of the transmission loss over the depth of the conductive pins 7a is relatively large as the depth of the conductive pins 7a is not more than 0.3 mm. Namely, as the height of the conductive pins 7a is within three fifth of the thickness of the dielectric substrate 1, the gradient of the transmission loss over the depth of the conductive pins 7a is relatively large. This means that the effect of reduction in the transmission loss by decreasing the depth or height of the conductive pins 1a is relatively large, as the height of the conductive pins 7a is within three fifth of the thickness of the dielectric substrate 1. As the height of the conductive pins 7a is beyond three fifth of the thickness of the dielectric substrate 1, then the gradient of the transmission loss over the depth of the conductive pins 7a is relatively gentle. If the depth of the conductive pins 7a is 0.25 mm or one half of the thickness of the dielectric substrate 1, the transmission loss is 0.10 (dB/mm). If no conductive pins are formed, the transmission loss is 0.21. The conductive pins 7a having the depth corresponding to one half of the thickness of the dielectric substrate reduces the transmission loss to about one half of that when no conductive pins are formed.

The conductive pins 7a extending in the vertical direction to the first and second surfaces of the dielectric substrate suppress coupling between the signal waveguide mode and the parallel-plate mode, whereby the transmission loss can be prevented.

Further, the conductive pins 7a are in contact with only the first ground conductive layers 3, so that the conductive pins 7a are separated by the dielectric substrate 1 from the second ground conductive layer 4. Namely, the conductive pins 7a do not penetrate the dielectric substrate 1 in view of the vertical direction to the first and second surfaces of the dielectric substrate 1, whereby the dielectric substrate 1 has a high mechanical strength and a high thermal stress stability.

Furthermore, the conductive pins 7a do not penetrate the dielectric substrate 1. This means that no penetrating holes are formed, whereby it is possible to keep a high scaling effect for package in multi-layer substrate.

As a modification to the above structure, it is possible that in place of each alignment of the conductive pins 7a, a continuous or discontinuous groove filled with a conductive material may be formed. In this case, the effect of suppression to the coupling between the signal waveguide mode and the parallel-plate mode is further improved.

As a further modification to the above structure, it is possible that the above novel structure may be applied to a slot structure in place of the co-planar structure. In the slot structure, a single first ground conductive layer and a single alignment of the conductive pins 7a are provided. Namely, either left or right part from the signal conductive layer 2 is eliminated in FIGS. 4A and 4B.

Second Embodiment

Figure 5A:
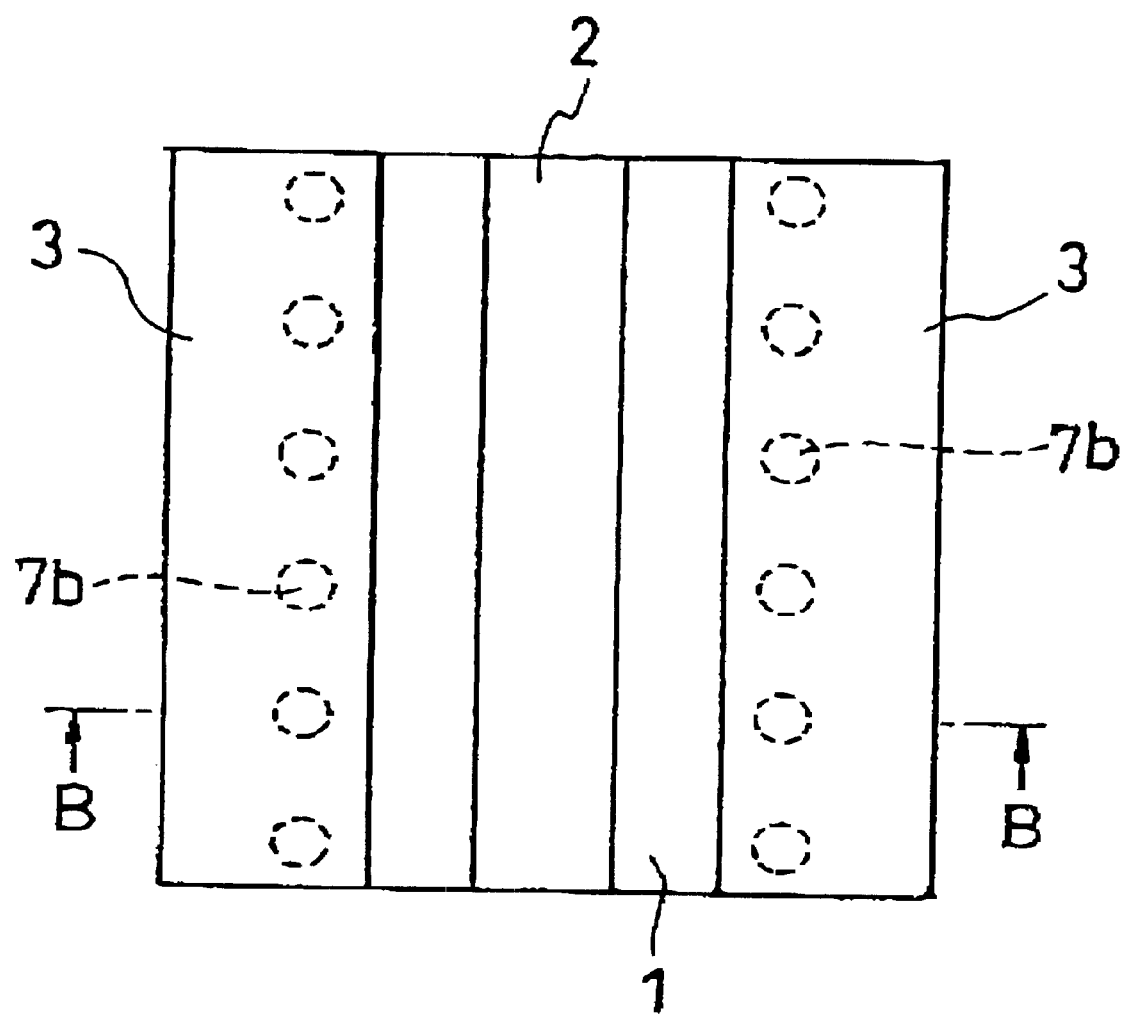
FIG. 5A is a fragmentary plane view illustrative of a novel structure of a co-planer transmission line in a second embodiment in accordance with the present invention.
Figure 5B:
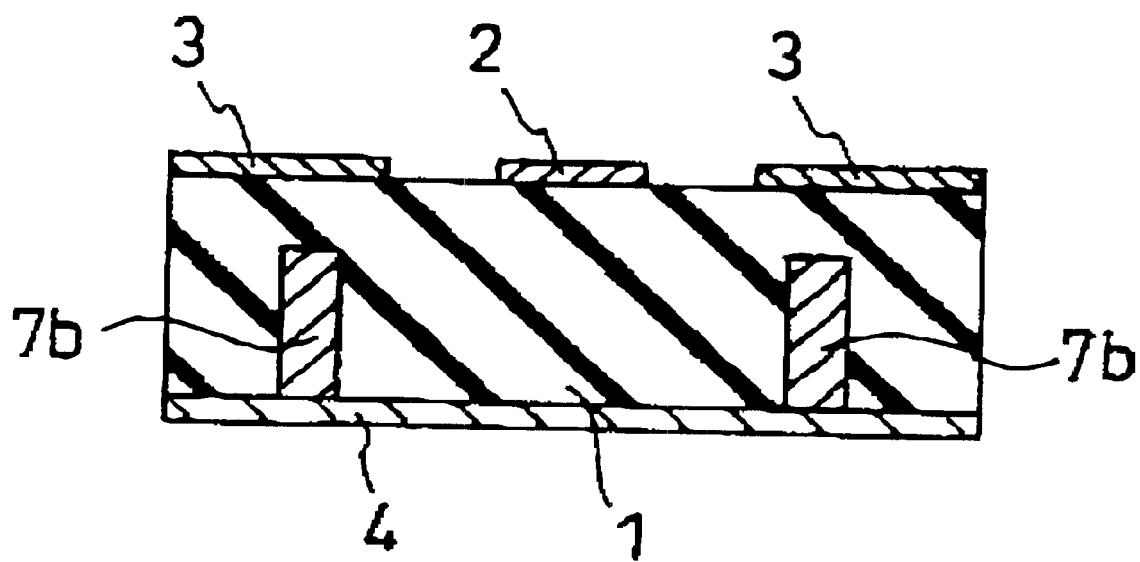
FIG. 5B is a fragmentary cross sectional elevation view taken along a B—B line of FIG. 5A and is illustrative of a novel structure of a co-planer transmission line in a second embodiment in accordance with the present invention.

A second embodiment according to the present invention will be described in detail with reference to the drawings. FIG. 5A is a fragmentary plane view illustrative of a novel structure of a co-planer transmission line in a second embodiment in accordance with the present invention. FIG. 5B is a fragmentary cross sectional elevation view taken along a B—B line of FIG. 5A and is illustrative of a novel structure of a co-planer transmission line in a second embodiment in accordance with the present invention.

A signal conductive layer 2 as a co-planer transmission line is selectively formed on a top surface of a dielectric substrate 1 which is made of a ceramic. Two ground conductive layers 3 are selectively formed on the top surface of the dielectric substrate 1, so that the ground conductive layers 3 extend in opposite sides of the signal conductive layer 2, provided that the ground conductive layers 3 are distanced from opposite side edges of the signal conductive layer 2. A bottom ground conductive layer 4 is formed entirely on a bottom surface of the dielectric substrate 1. The ground conductive layers 3 and the bottom ground conductive layer 4 are grounded to be substantially fixed at ground potential.

A pair of first and second single alignments of conductive pins 7b is provided in a longitudinal direction of the signal conductive layer 2, wherein signals are propagated in the longitudinal direction. The conductive pins 7b extend in the dielectric substrate 1. The conductive pins 7b extend under inside parts of the ground conductive layers 3 near the signal conductive layer 2. The bottom portions of the conductive pins 7b are in contact directly with the bottom ground conductive layer 4, whilst the top portions of the conductive pins 7b are separated by the dielectric substrate 1 from the top ground conductive layers 3. The conductive pins 7b have a predetermined uniform top level which is lower than the top ground conductive layers 3. The conductive pins 7b are aligned at a constant pitch which is less than one half of a wavelength of the signal to be transmitted through the signal conductive layer 2, so that the signal wave can sense the conductive pins 7b.

The conductive pins 7b extending in the vertical direction to the first and second surfaces of the dielectric substrate suppress coupling between the signal waveguide mode and the parallel-plate mode, whereby the transmission loss can be prevented.

Further, the conductive pins 7b are in contact with only the bottom ground conductive layer 4, so that the conductive pins 7b are separated by the dielectric substrate 1 from the top ground conductive layers 3. Namely, the conductive pins 7b do not penetrate the dielectric substrate 1 in view of the vertical direction to the first and second surfaces of the dielectric substrate 1, whereby the dielectric substrate 1 has a high mechanical strength and a high thermal stress stability.

Furthermore, the conductive pins 7b do not penetrate the dielectric substrate 1. This means that no penetrating holes are formed, whereby it is possible to keep a high sealing effect for package in multi-layer substrate.

As a modification to the above structure, it is possible that in place of each alignment of the conductive pins 7b, a continuous or discontinuous groove filled with a conductive material may be formed. In this case, the effect of suppression to the coupling between the signal waveguide mode and the parallel-plate mode is further improved.

As a further modification to the above structure, it is possible that the above novel structure may be applied to a slot structure in place of the co-planar structure. In the slot structure, a single first ground conductive layer and a single alignment of the conductive pins 7b are provided. Namely, either left or right part from the signal conductive layer 2 is eliminated in FIGS. 5A and 5B.

Third Embodiment

Figure 6A:
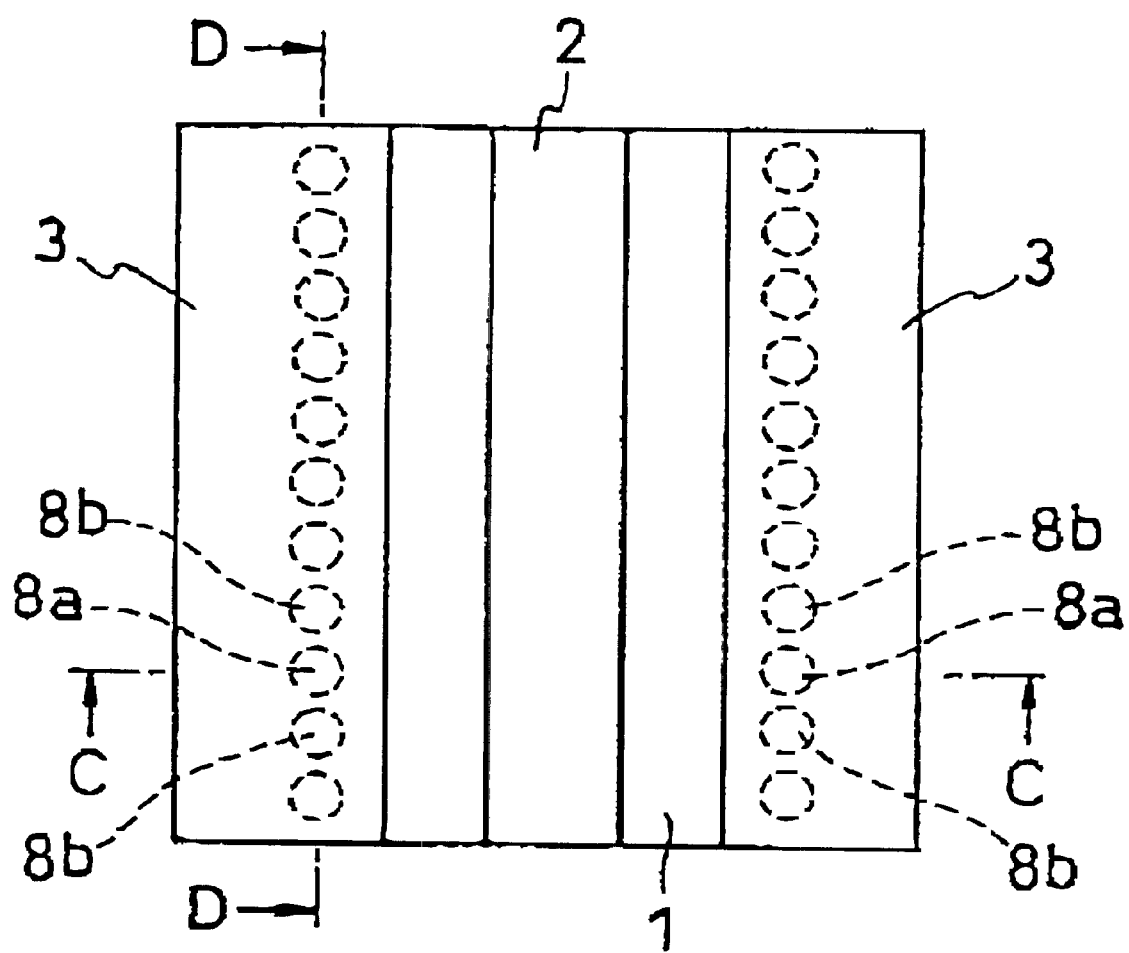
FIG. 6A is a fragmentary plane view illustrative of a novel structure of a co-planer transmission line in a third embodiment in accordance with the present invention.
Figure 6B:
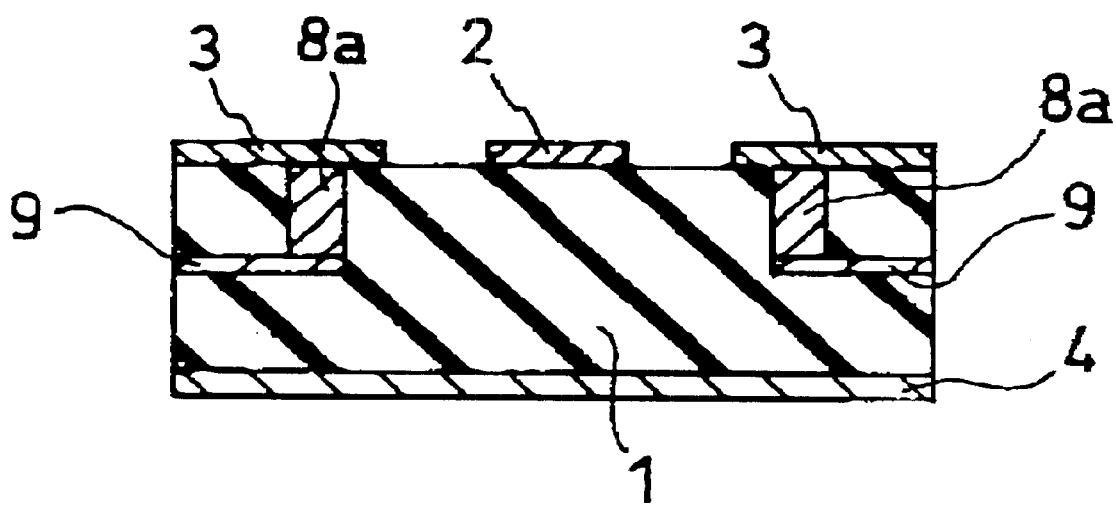
FIG. 6B is a fragmentary cross sectional elevation view taken along a C—C line of FIG. 6A and is illustrative of a novel structure of a co-planer transmission line in a third embodiment in accordance with the present invention.
Figure 6C:
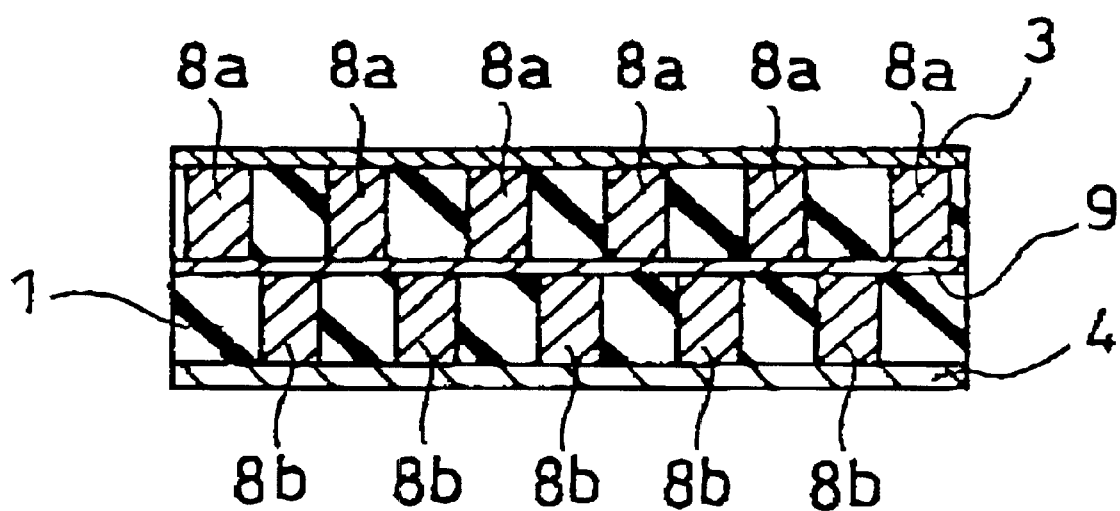
FIG. 6C is a fragmentary cross sectional elevation view taken along a D—D line of FIG. 6A and is illustrative of a novel structure of a co-planer transmission line in a third embodiment in accordance with the present invention.

A third embodiment according to the present invention will be described in detail with reference to the drawings. FIG. 6A is a fragmentary plane view illustrative of a novel structure of a co-planer transmission line in a third embodiment in accordance with the present invention. FIG. 6B is a fragmentary cross sectional elevation view taken along a C—C line of FIG. 6A and is illustrative of a novel structure of a co-planer transmission line in a third embodiment in accordance with the present invention. FIG. 6C is a fragmentary cross sectional elevation view taken along a D—D line of FIG. 6A and is illustrative of a novel structure of a co-planer transmission line in a third embodiment in accordance with the present invention.

A signal conductive layer 2 as a co-planer transmission line is selectively formed on a top surface of a dielectric substrate 1 which is made of a ceramic. Two ground conductive layers 3 are selectively formed on the top surface of the dielectric substrate 1, so that the ground conductive layers 3 extend in opposite sides of the signal conductive layer 2, provided that the ground conductive layers 3 are distanced from opposite side edges of the signal conductive layer 2. A bottom ground conductive layer 4 is formed entirely on a bottom surface of the dielectric substrate 1. The ground conductive layers 3 and the bottom ground conductive layer 4 are grounded to be substantially fixed at ground potential.

A pair of first and second alignments is provided in a longitudinal direction of the signal conductive layer 2, wherein signals are propagated in the longitudinal direction. The first alignment further comprises a first top sub-alignment of top conductive vias 8a and a first bottom sub-alignment of bottom conductive vias 8b. The second alignment further comprises a second top sub-alignment of top conductive vias 8a and a second bottom sub-alignment of bottom conductive vias 8b. The top and bottom conductive vias 8a and 8b extend in the dielectric substrate 1. The top and bottom conductive vias 8a and 8b extend under inside parts of the ground conductive layers 3 near the signal conductive layer 2. The top conductive vias 8a extend in an upper half region of the dielectric substrate 1, whilst the bottom conductive vias 8b extend in a lower half region of the dielectric substrate 1. Intermediate ground conductive layers 9 are further provided in the dielectric substrate 1. The intermediate ground conductive layers 9 underlay the ground conductive layers 3, provided that the intermediate ground conductive layers 9 have an intermediate level in thickness direction of the dielectric substrate 1. The top portions of the top conductive vias 8a are in contact directly with the top ground conductive layers 3, whilst the bottom portions of the top conductive vias 8a are in contact directly with the intermediate ground conductive layers 9. The bottom portions of the bottom conductive vias 8b are in contact directly with the bottom ground conductive layer 4, whilst the top portions of the bottom conductive vias 8b are in contact directly with the intermediate ground conductive layers 9. The top and bottom conductive vias 8a and 8b are connected to each other through the intermediate ground conductive layers 9. The top conductive vias 8a are aligned at a constant pitch which is less than one half of a wavelength of the signal to be transmitted through the signal conductive layer 2, so that the signal wave can sense the top conductive vias 8a. The bottom conductive vias 8b are also aligned at a constant pitch which is less than one half of a wavelength of the signal to be transmitted through the signal conductive layer 2, so that the signal wave can sense the bottom conductive vias 8b. It is, however, important that the top conductive vias 8a are displaced from the bottom conductive vias 8b in the longitudinal direction of the signal conductive layer along which the signal is propagated, so that the top conductive vias 8a and the bottom conductive vias 8b are alternately positioned in the longitudinal direction of the signal conductive layer. The bottom portions of the top conductive vias 8a are separated by the dielectric substrate 1 from the bottom ground conductive layer 4. The top portions of the bottom conductive vias 8b are separated by the dielectric substrate 1 from the top ground conductive layers 3.

The top and bottom conductive vias 8a and 8b extending in the vertical direction to the first and second surfaces of the dielectric substrate suppress coupling between the signal waveguide mode and the parallel-plate mode, whereby the transmission loss can be prevented.

Further, the top conductive vias 8a are in contact with only the top ground conductive layers 3, so that the top conductive vias 8a are separated by the dielectric substrate 1 from the bottom ground conductive layer 4. Namely, the top conductive vias 8a do not penetrate the dielectric substrate 1 in view of the vertical direction to the first and second surfaces of the dielectric substrate 1. The bottom conductive vias 8b are in contact with only the bottom ground conductive layer 4, so that the bottom conductive vias 8b are separated by the dielectric substrate 1 from the top ground conductive layers 3. Namely, the bottom conductive vias 8b do not penetrate the dielectric substrate 1 in view of the vertical direction to the first and second surfaces of the dielectric substrate 1. The dielectric substrate 1 has a high mechanical strength and a high thermal stress stability.

Furthermore, the top and bottom conductive vias 8a and 8b do not penetrate the dielectric substrate 1. This means that no penetrating holes are formed, whereby it is possible to keep a high sealing effect for package in multi-layer substrate.

Further, the top ground conductive layers 3 and the bottom ground conductive layer 4 are connected to each other through the top and bottom conductive vias 8a and 8b and the intermediate ground conductive layers 9, whereby the effect of the suppression to the coupling between the signal waveguide made and the parallel-plate mode is further improved with keeping the high mechanical strength and high thermal stress stability.

As a modification to the above structure, it is possible that the above novel structure may be applied to a slot structure in place of the coplanar structure. In the slot structure, a single first ground conductive layer and alignments of the top and bottom conductive vias 8a and 8b are provided. Namely, either left or right part from the signal conductive layer 2 is eliminated in FIGS. 6A, 6B and 6C.

Fourth Embodiment

Figure 7A:
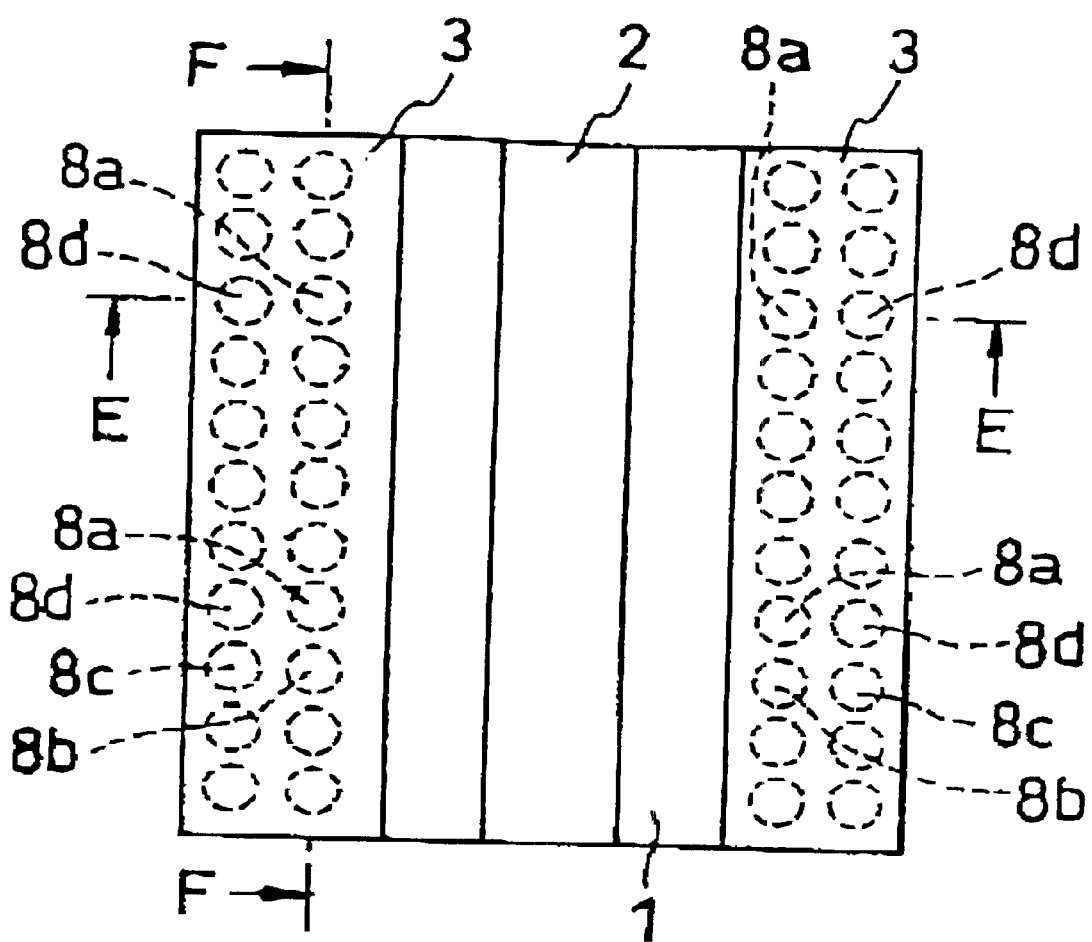
FIG. 7A is a fragmentary plane view illustrative of a novel structure of a co-planer transmission line in a fourth embodiment in accordance with the present invention.
Figure 7B:
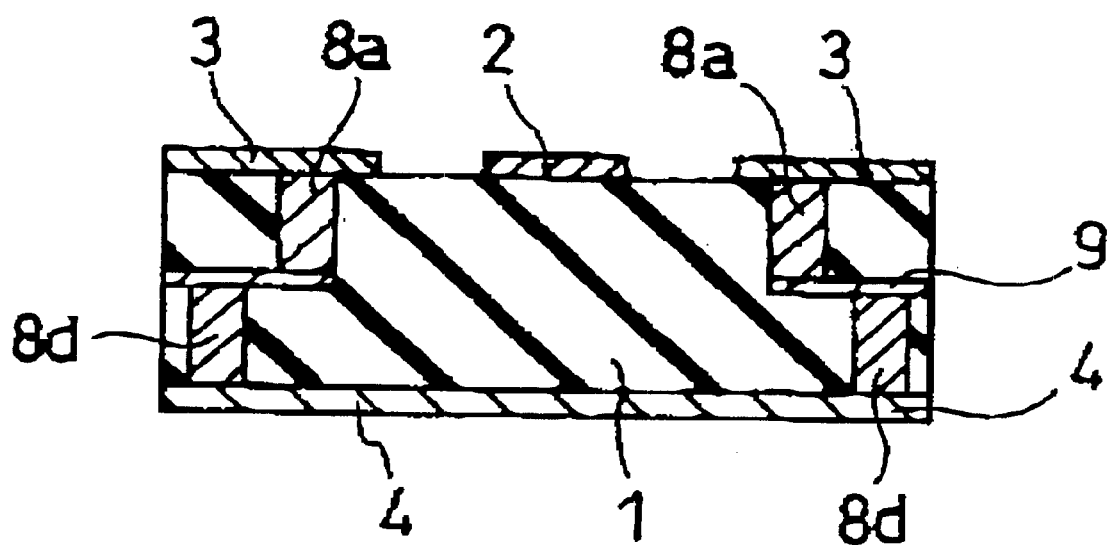
FIG. 7B is a fragmentary cross sectional elevation view taken along an E—E line of FIG. 7A and is illustrative of a novel structure of a co-planer transmission line in a fourth embodiment in accordance with the present invention.
Figure 7C:
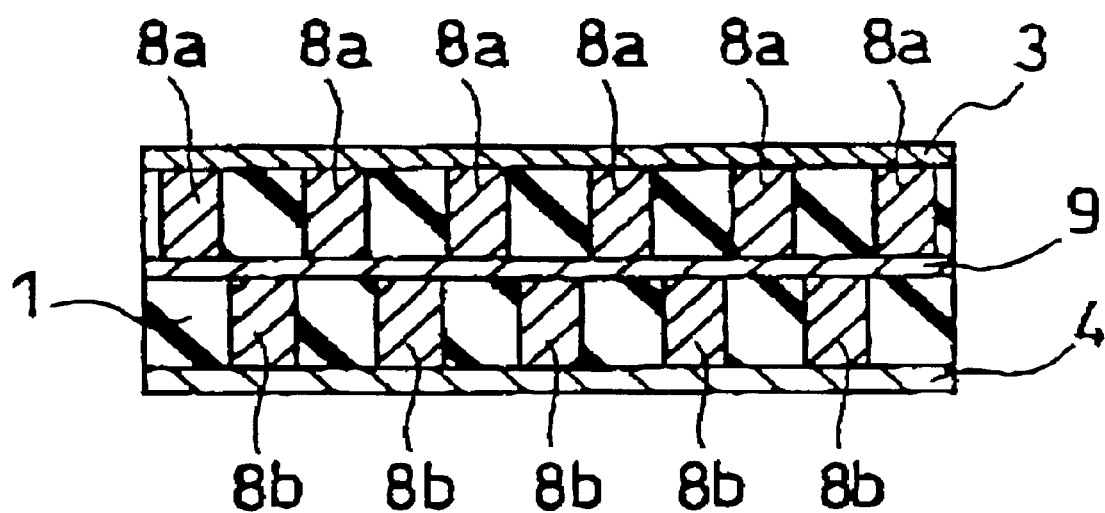
FIG. 7C is a fragmentary cross sectional elevation view taken along an F—F line of FIG. 7A and is illustrative of a novel structure of a co-planer transmission line in a fourth embodiment in accordance with the present invention.

A fourth embodiment according to the present invention will be described in detail with reference to the drawings. FIG. 7A is a fragmentary plane view illustrative of a novel structure of a co-planer transmission line in a fourth embodiment in accordance with the present invention. FIG. 7B is a fragmentary cross sectional elevation view taken along an E—E line of FIG. 7A and is illustrative of a novel structure of a co-planer transmission line in a fourth embodiment in accordance with the present invention. FIG. 7C is a fragmentary cross sectional elevation view taken along an F—F line of FIG. 7A and is illustrative of a novel structure of a co-planer transmission line in a fourth embodiment in accordance with the present invention.

A signal conductive layer 2 as a co-planer transmission line is selectively formed on a top surface of a dielectric substrate 1 which is made of a ceramic. Two ground conductive layers 3 are selectively formed on the top surface of the dielectric substrate 1, so that the ground conductive layers 3 extend in opposite sides of the signal conductive layer 2, provided that the ground conductive layers 3 are distanced from opposite side edges of the signal conductive layer 2. A bottom ground conductive layer 4 is formed entirely on a bottom surface of the dielectric substrate 1 The ground conductive layers 3 and the bottom ground conductive layer 4 are grounded to be substantially fixed at ground potential.

A pair of first and second dual alignments is provided in a longitudinal direction of the signal conductive layer 2, wherein signals are propagated in the longitudinal direction. The first dual alignments further comprise a first inside top sub-alignment of inside top conductive vias 8a, a first inside bottom sub-alignment of inside bottom conductive vias 8b, a first outside top sub-alignment of outside top conductive vias 8c, and a first outside bottom sub-alignment of outside bottom conductive vias 8d. The second dual alignments further comprise a second inside top sub-alignment of inside top conductive vias 8a, a second inside bottom sub-alignment of inside bottom conductive vias 8b, a second outside top sub-alignment of outside top conductive vias 8c, and a second outside bottom sub-alignment of outside bottom conductive vias 8d. The inside top, inside bottom, outside top and outside bottom conductive vias 8a, 8b, 8c and 8d extend in the dielectric substrate 1. The inside top, inside bottom, outside top and outside bottom conductive vias 8a, 8b, 8c and 8d extend under inside parts of the ground conductive layers 3 near the signal conductive layer 2. The inside and output top conductive vias 8a and 8c extend in an upper half region of the dielectric substrate 1, whilst the inside and outside bottom conductive vias 8b and 8d extend in a lower half region of the dielectric substrate 1. Intermediate ground conductive layers 9 are further provided in the dielectric substrate 1 The intermediate ground conductive layers 9 underlay the ground conductive layers 3, provided that the intermediate ground conductive layers 9 have an intermediate level in thickness direction of the dielectric substrate 1. The top portions of the inside and outside top conductive vias 8a and 8c are in contact directly with the top ground conductive layers 3, whilst the bottom portions of the inside and outside top conductive vias 8a and 8c are in contact directly with the intermediate ground conductive layers 9. The bottom portions of the inside and outside bottom conductive vias 8b and 8d are in contact directly with the bottom ground conductive layer 4, whilst the top portions of the inside and outside bottom conductive vias 8b and 8d are in contact directly with the intermediate ground conductive layers 9. The inside top and bottom conductive vias 8a and 8b are connected to each other through the intermediate ground conductive layers 9. The outside top and bottom conductive vias 8c and 8d are also connected to each other through the intermediate ground conductive layers 9. The inside top conductive vias 8a are aligned at a constant pitch which is less than one half of a wavelength of the signal to be transmitted through the signal conductive layer 2, so that the signal wave can sense the top conductive vias 8a. The inside bottom conductive vias 8b are also aligned at a constant pitch which is less than one half of a wavelength of the signal to be transmitted through the signal conductive layer 2, so that the signal wave can sense the bottom conductive vias 8b. The outside top conductive vias 8c are aligned at a constant pitch which is less than one half of a wavelength of the signal to be transmitted through the signal conductive layer 2, so that the signal wave can sense the outside top conductive vias 8c. The outside bottom conductive vias 8d are also aligned at a constant pitch which is less than one half of a wavelength of the signal to be transmitted through the signal conductive layer 2, so that the signal wave can sense the outside bottom conductive vias 8d. It is, however, important that the inside top conductive vias 8a are displaced from the inside bottom conductive vias 8b in the longitudinal direction of the signal conductive layer along which the signal is propagated, so that the inside top conductive vias 8a and the inside bottom conductive vias 8b are alternately positioned in the longitudinal direction of the signal conductive layer. The bottom portions of the inside top conductive vias 8a are separated by the dielectric substrate 1 from the bottom ground conductive layer 4. The top portions of the inside bottom conductive vias 8b are separated by the dielectric substrate 1 from the top ground conductive layers 3. It is also important that the outside top conductive vias 8c are displaced from the outside bottom conductive vias 8d in the longitudinal direction of the signal conductive layer along which the signal is propagated, so that the outside top conductive vias 8c and the outside bottom conductive vias 8d are alternately positioned in the longitudinal direction of the signal conductive layer. The bottom portions of the outside top conductive vias 8c are separated by the dielectric substrate 1 from the bottom ground conductive layer 4. The top portions of the outside bottom conductive vias 8d are separated by the dielectric substrate 1 from the top ground conductive layers 3.

The inside top, inside bottom, output top and outside bottom conductive vias 8a, 8b, 8c and 8d extending in the vertical direction to the first and second surfaces of the dielectric substrate suppress coupling between the signal waveguide mode and the parallel-plate mode, whereby the transmission loss can be prevented.

Further, the inside top conductive vias 8a are in contact with only the top ground conductive layers 3, so that the inside top conductive vias 8a are separated by the dielectric substrate 1 from the bottom ground conductive layer 4. Namely, the inside top conductive vias 8a do not penetrate the dielectric substrate 1 in view of the vertical direction to the first and second surfaces of the dielectric substrate 1. The inside bottom conductive vias 8b are in contact with only the bottom ground conductive layer 4, so that the bottom conductive vias 8b are separated by the dielectric substrate 1 from the top ground conductive layers 3. Namely, the inside bottom conductive vias 8b do not penetrate the dielectric substrate 1 in view of the vertical direction to the first and second surfaces of the dielectric substrate 1.

Furthermore, the outside top conductive vias 8c are in contact with only the top ground conductive layers 3, so that the outside top conductive vias 8c are separated by the dielectric substrate 1 from the bottom ground conductive layer 4. Namely, the outside top conductive vias 8c do not penetrate the dielectric substrate 1 in view of the vertical direction to the first and second surfaces of the dielectric substrate 1. The outside bottom conductive vias 8d are in contact with only the bottom ground conductive layer 4, so that the outside bottom conductive vias 8d are separated by the dielectric substrate 1 from the top ground conductive layers 3. Namely, the outside bottom conductive vias 8d do not penetrate the dielectric substrate 1 in view of the vertical direction to the first and second surfaces of the dielectric substrate 1. The dielectric substrate 1 has a high mechanical strength and a high thermal stress stability.

Moreover, the inside top, inside bottom, output top and outside bottom conductive vias 8a, 8b, 8c and 8d do not penetrate the dielectric substrate 1. This means that no penetrating holes are formed, whereby it is possible to keep a high sealing effect for package in multi-layer substrate.

Further, the top ground conductive layers 3 and the bottom ground conductive layer 4 are connected to each other through the inside top, inside bottom, output top and outside bottom conductive vias 8a, 8b, 8c and 8d and the intermediate ground conductive layers 9, whereby the effect of the suppression to the coupling between the signal waveguide made and the parallel-plate mode is further improved with keeping the high mechanical strength and high thermal stress stability.

As a modification to the above structure, it is possible that the above novel structure may be applied to a slot structure in place of the coplanar structure. In the slot structure, a single first ground conductive layer and alignments of the top and bottom conductive vias 8a and 8b are provided. Namely, either left or right part from the signal conductive layer 2 is eliminated in FIGS. 7A, 7B and 7C.

Fifth Embodiment

Figure 8A:
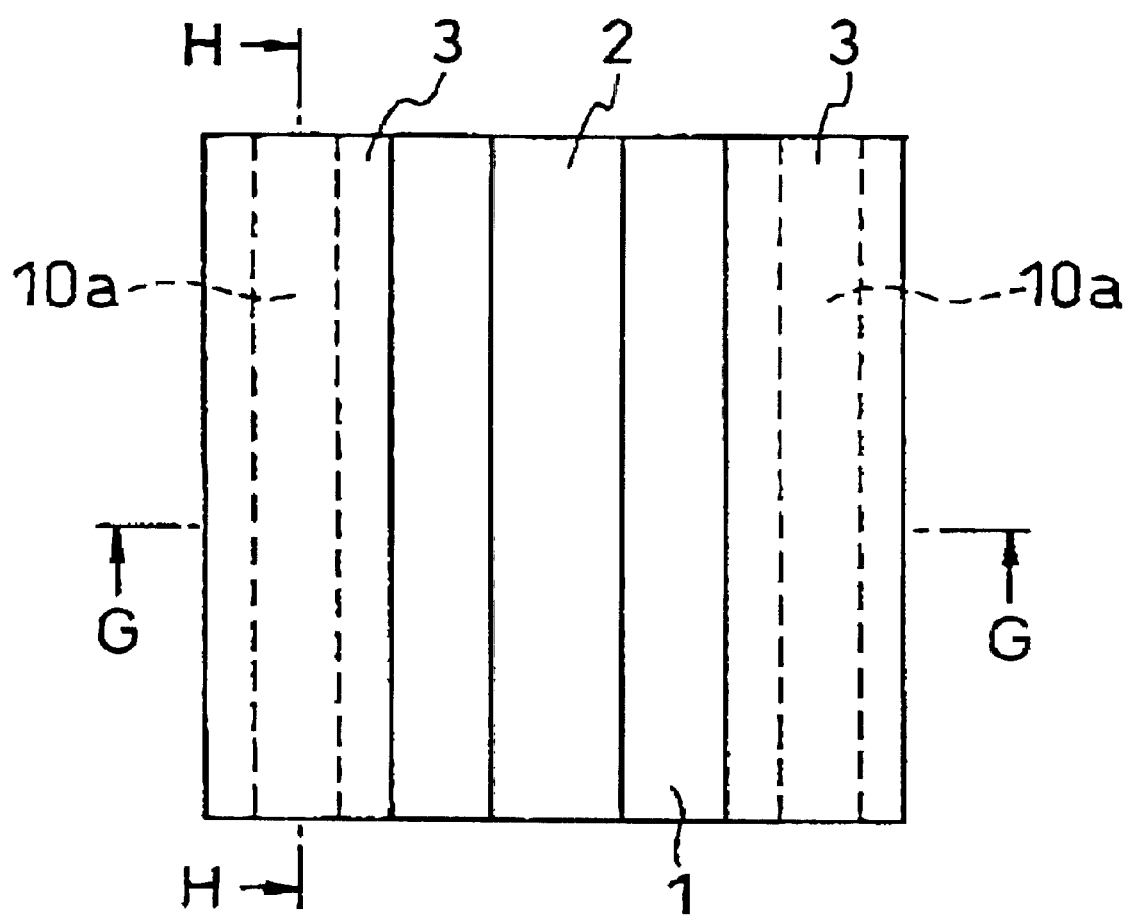
FIG. 8A is a fragmentary plane view illustrative of a novel structure of a co-planer transmission line in a fifth embodiment in accordance with the present invention.
Figure 8B:
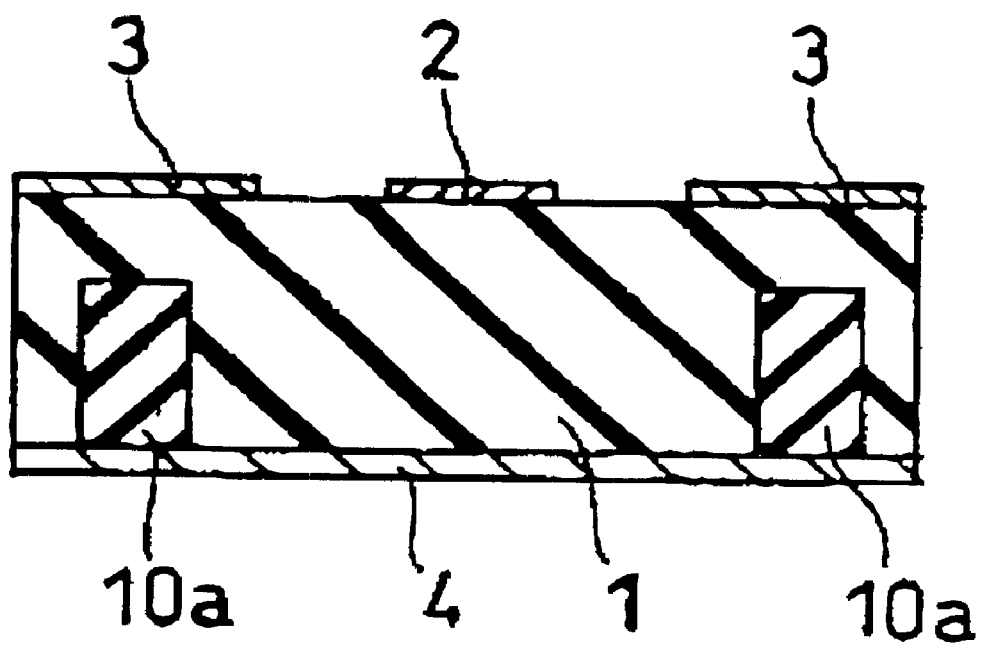
FIG. 8B is a fragmentary cross sectional elevation view taken along a G—G line of FIG. 8A and is illustrative of a novel structure of a co-planer transmission line in a fifth embodiment in accordance with the present invention.
Figure 8C:
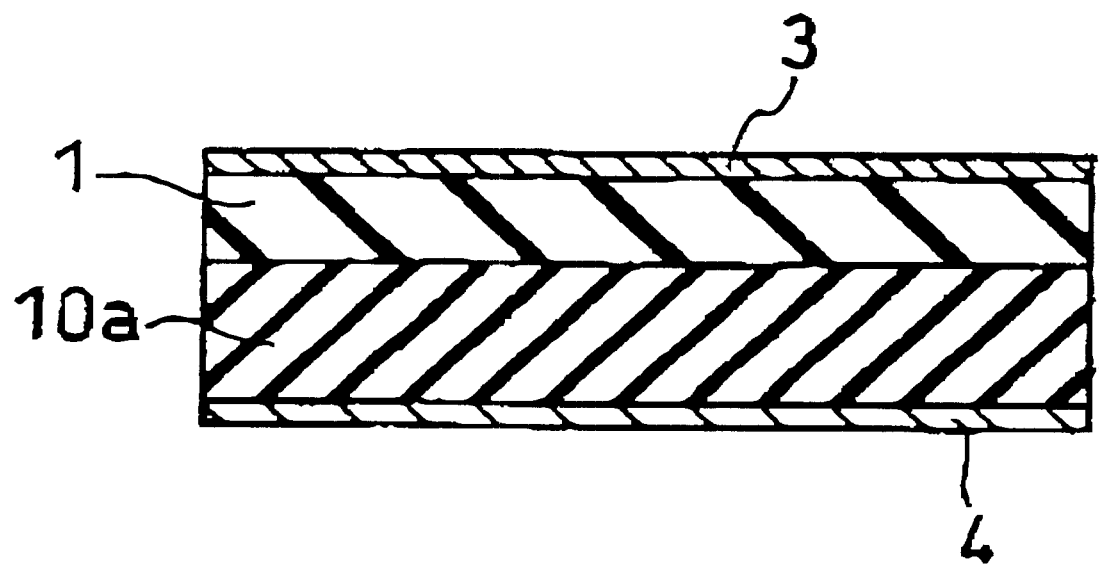
FIG. 8C is a fragmentary cross sectional elevation view taken along an H—H line of FIG. 8A and is illustrative of a novel structure of a co-planer transmission line in a fifth embodiment in accordance with the present invention.

A fifth embodiment according to the present invention will be described in detail with reference to the drawings. FIG. 8A is a fragmentary plane view illustrative of a novel structure of a co-planer transmission line in a fifth embodiment in accordance with the present invention. FIG. 8B is a fragmentary cross sectional elevation view taken along a G—G line of FIG. 8A and is illustrative of a novel structure of a co-planer transmission line in a fifth embodiment in accordance with the present invention. FIG. 8C is a fragmentary cross sectional elevation view taken along an H—H line of FIG. 8A and is illustrative of a novel structure of a co-planer transmission line in a fifth embodiment in accordance with the present invention.

A signal conductive layer 2 as a co-planer transmission line is selectively formed on a top surface of a dielectric substrate 1 which is made of a ceramic. Two ground conductive layers 3 are selectively formed on the top surface of the dielectric substrate 1, so that the ground conductive layers 3 extend in opposite sides of the signal conductive layer 2, provided that the ground conductive layers 3 are distanced from opposite side edges of the signal conductive layer 2. A bottom ground conductive layer 4 is formed entirely on a bottom surface of the dielectric substrate 1. The ground conductive layers 3 and the bottom ground conductive layer 4 are grounded to be substantially fixed at ground potential.

A pair of first and second continuing trench grooves 10a filled with a dielectric material having a lower dielectric constant than the dielectric substrate 1 is provided in a longitudinal direction of the signal conductive layer 2, wherein signals are propagated in the longitudinal direction. The first and second continuing trench grooves 10a extend in the dielectric substrate 1. The first and second continuing trench grooves 10a extend under inside parts of the ground conductive layers 3 near the signal conductive layer 2. The bottom portions of the first and second continuing trench grooves 10a are in contact directly with the bottom ground conductive layer 4, whilst the top portions of the first and second continuing trench grooves 10a are separated by the dielectric substrate 1 from the top ground conductive layers 3. The first and second continuing trench grooves 10a have a predetermined uniform top level which is lower than the top ground conductive layers 3.

A preferable thickness or a depth of the first and second continuing trench grooves 10a depends upon the frequency of the signal and the dielectric constant of the dielectric substrate 1. It is important that a subtraction of a height in said vertical direction of the first and second continuing trench grooves 10a from a thickness of said dielectric substrate 1 is less than a value of $c/\{4f(\in_r-1)^{1/2}\}$, where "c" is the speed of light, "f" is the frequency of signal, and "$\in_r$" is the dielectric constant of the dielectric substrate 1. If the depth or thickness of the first and second continuing trench grooves 10a is decreased, then the effect of suppression to the transmission loss is decreased, whilst the effects of improvements in mechanical strength and thermal stress stability of the dielectric substrate is increased. If the depth or thickness of the first and second continuing trench grooves 10a is increased, then the effect of suppression to the transmission is increased, whilst the effects of improvements in mechanical strength and thermal stress stability of the dielectric substrate is decreased. Preferable range of the depth or thickness of the first and second continuing trench grooves 10a depend upon the frequency of the signal and the dielectric constant of the dielectric substrate 1, for which reason the depth or thickness of the first and second continuing trench grooves 10a is preferably decided so that a subtraction of the depth or thickness of the first and second continuing trench grooves 10a from the thickness of the dielectric substrate is less than a value of $c/\{4f(\in_r-1)^{1/2}\}$.

Figure 12:
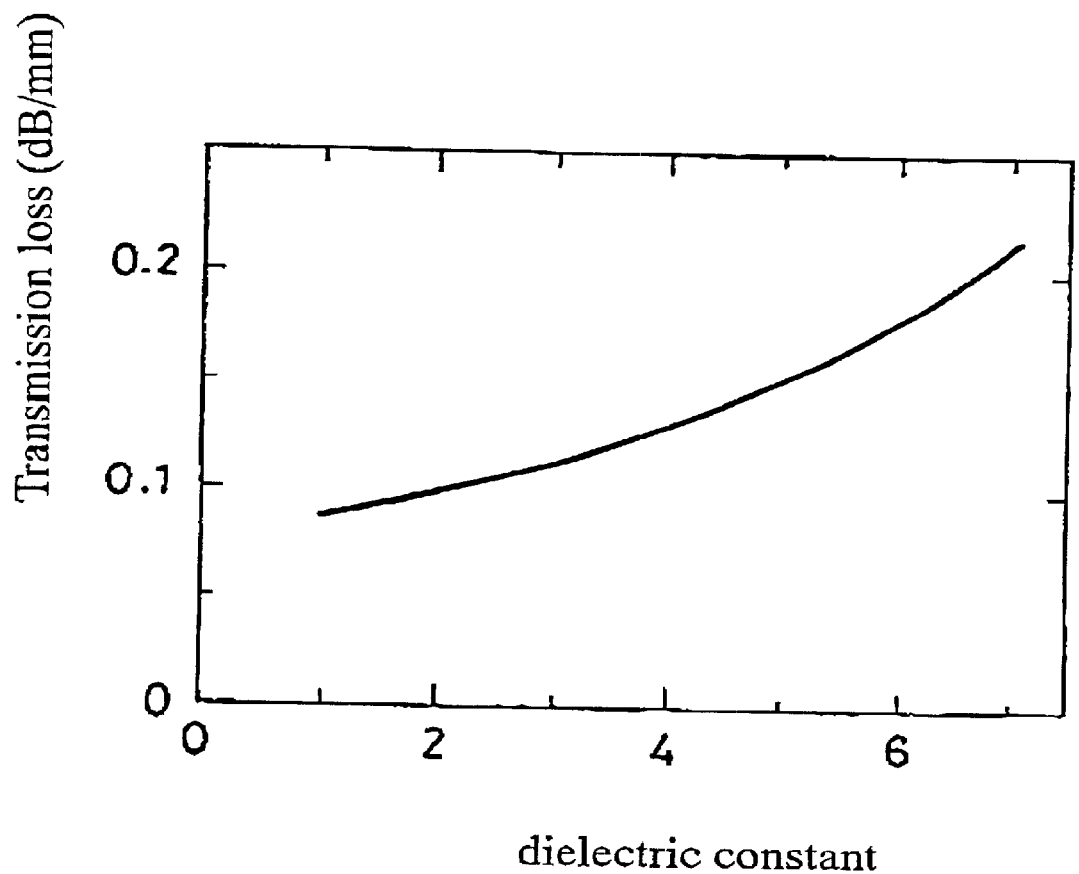
FIG. 12 is a diagram illustrative of variations in transmission loss over dielectric constant of the dielectric material filled into the trench groove in the dielectric substrate, wherein the dielectric substrate has a dielectric constant of 7.1 and a frequency of the signal to be transmitted through the signal conductive layer 2 is 60 GHz.

FIG. 12 is a diagram illustrative of variations in transmission loss over dielectric constant of the dielectric material filled into the trench groove in the dielectric substrate, wherein the dielectric substrate has a dielectric constant of 7.1 and a frequency of the signal to be transmitted through the signal conductive layer 2 is 60 GHz. As the dielectric constant of the dielectric material filled into the trench groove in the dielectric substrate is decreased, the transmission loss is also decreased. If the dielectric constant of the dielectric material is 4.0, the transmission loss is 0.13 dB/mm which is much lower than a transmission loss of 0.21 dB/mm obtained when no trench groove is formed in the dielectric substrate 1. It is possible to fill an air into the trench grooves in place of the low dielectric constant solid-state material, so that the transmission loss is further reduced due to much lower dielectric constant of the air than the low dielectric constant solid-state material.

As described above, the first and second continuing trench grooves 10a are filled with the dielectric material having the lower dielectric constant than the dielectric substrate 1. Further, the first and second continuing trench grooves 10a are positioned under inside parts of the top ground conductive layers 3 near the signal conductive line 2, whereby the coupling between the signal waveguide mode and the parallel-plate mode is suppressed.

Further, the dielectric material filling the first and second continuing trench grooves 10a is solid-state, for which reason the mechanical strength of the dielectric substrate 1 is improved.

Furthermore, the first and second continuing trench grooves 10a do not penetrate the dielectric substrate 1. This means that no penetrating grooves are formed, whereby it is possible to keep a high sealing effect for package in multilayer substrate.

As a modification to the above structure, the bottom portions of the first and second continuing trench grooves 10a are separated by the dielectric substrate 1 from the bottom ground conductive layer 4, whilst the top portions of the first and second continuing trench grooves 10a are in contact directly with the top ground conductive layers 3 and also in contact directly with the signal conductive layer 2.

As a further modification to the above structure, the bottom portions of the first and second continuing trench grooves 10a are separated by the dielectric substrate 1 from the bottom ground conductive layer 4, whilst the top portions of the first and second continuing trench grooves 10a are separated by the dielectric substrate 1 from the top ground conductive layers 3 and also from the signal conductive layer 2.

As a still further modification to the above structure, it is possible that in place of the continuing trench grooves, alignments of non-penetrating holes filled with the dielectric material having the lower dialectic constant than the dielectric substrate 1. In this case, the effect of increasing in mechanical strength of the dielectric substrate 1 is further improved.

As yet further modification to the above structure, it is possible that the above novel structure may be applied to a slot structure in place of the co-planar structure. In the slot structure, a single first ground conductive layer and a single trench groove are provided. Namely, either left or right part from the signal conductive layer 2 is eliminated in FIGS. 8A, 8B and 8C.

Sixth Embodiment

Figure 9A:
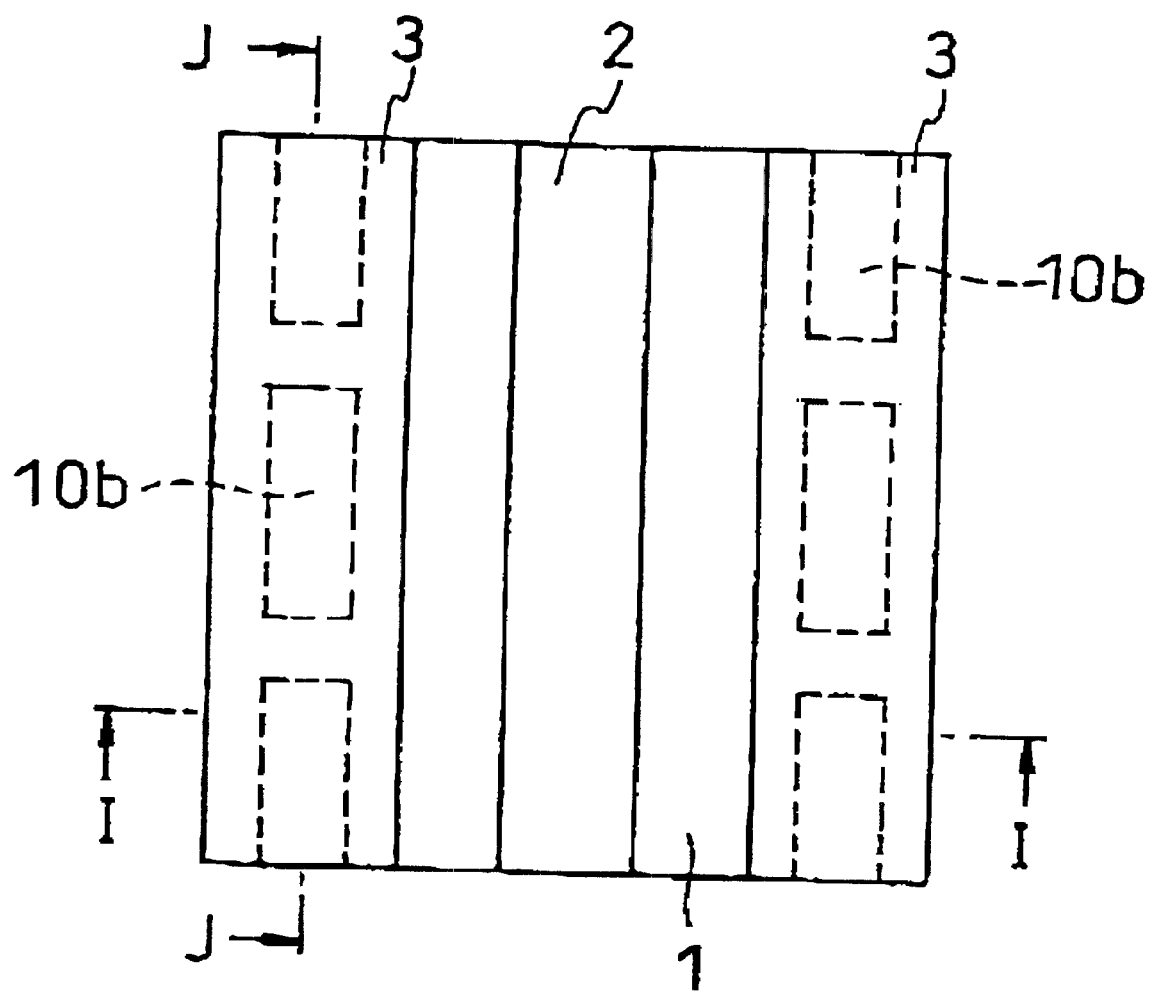
FIG. 9A is a fragmentary plane view illustrative of a novel structure of a co-planer transmission line in a sixth embodiment in accordance with the present invention
Figure 9B:
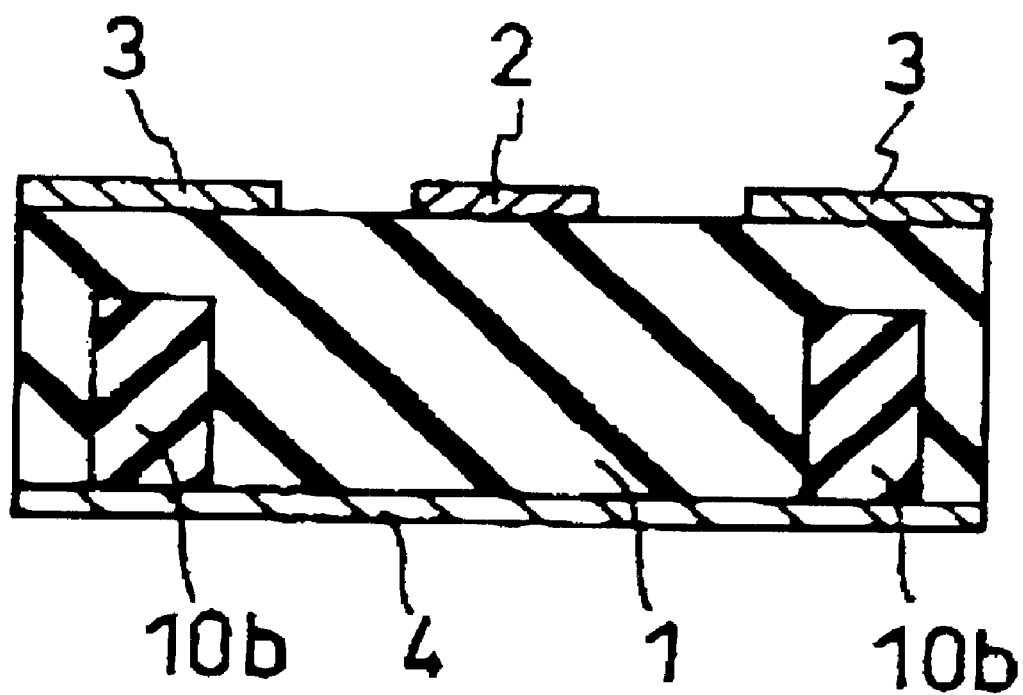
FIG. 9B is a fragmentary cross sectional elevation view taken along an I—I line of FIG. 9A and is illustrative of a novel structure of a co-planer transmission line in a sixth embodiment in accordance with the present invention.
Figure 9C:
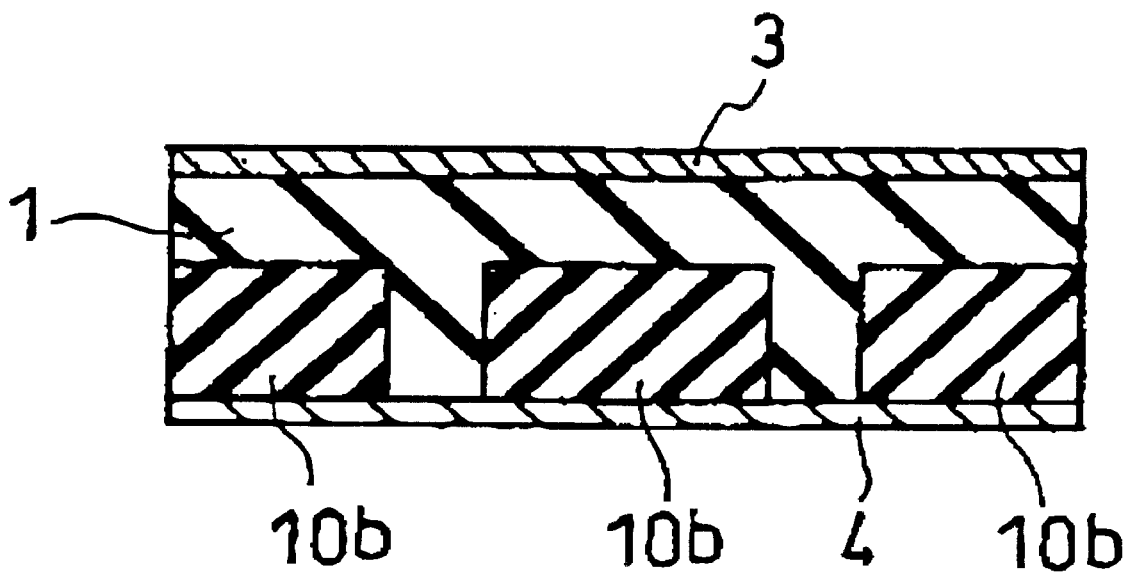
FIG. 9C is a fragmentary cross sectional elevation view taken along a J—J line of FIG. 9A and is illustrative of a novel structure of a co-planer transmission line in a sixth embodiment in accordance with the present invention.

A sixth embodiment according to the present invention will be described in detail with reference to the drawings. FIG. 9A is a fragmentary plane view illustrative of a novel structure of a co-planer transmission line in a sixth embodiment in accordance with the present invention. FIG. 9B is a fragmentary cross sectional elevation view taken along an I—I line of FIG. 9A and is illustrative of a novel structure of a co-planer transmission line in a sixth embodiment in accordance with the present invention. FIG. 9C is a fragmentary cross sectional elevation view taken along a J—J line of FIG. 9A and is illustrative of a novel structure of a co-planer transmission line in a sixth embodiment in accordance with the present invention.

A signal conductive layer 2 as a co-planer transmission line is selectively formed on a top surface of a dielectric substrate 1 which is made of a ceramic. Two ground conductive layers 3 are selectively formed on the top surface of the dielectric substrate 1, so that the ground conductive layers 3 extend in opposite sides of the signal conductive layer 2, provided that the ground conductive layers 3 are distanced from opposite side edges of the signal conductive layer 2. A bottom ground conductive layer 4 is formed entirely on a bottom surface of the dielectric substrate 1. The ground conductive layers 3 and the bottom ground conductive layer 4 are grounded to be substantially fixed at ground potential.

A pair of first and second discontinuing trench grooves 10b filled with a dielectric material having a lower dielectric constant than the dielectric substrate 1 is provided in a longitudinal direction of the signal conductive layer 2, wherein signals are propagated in the longitudinal direction. The first and second discontinuing trench grooves 10b extend in the dielectric substrate 1. The first and second discontinuing trench grooves 10b extend under inside parts of the ground conductive layers 3 near the signal conductive layer 2. The bottom portions of the first and second discontinuing trench grooves 10b are in contact directly with the bottom ground conductive layer 4, whilst the top portions of the first and second discontinuing trench grooves 10b are separated by the dielectric substrate 1 from the top ground conductive layers 3. The first and second discontinuing trench grooves 10b have a predetermined uniform top level which is lower than the top ground conductive layers 3. The first and second discontinuing trench grooves 10b are aligned at a constant distance between adjacent edges thereof, wherein the constant distance is less than one half of a wavelength of the signal to be transmitted through the signal conductive layer 2, so that the signal wave can sense the first and second discontinuing trench grooves 10b.

A preferable thickness or a depth of the first and second discontinuing trench grooves 10b depends upon the frequency of the signal and the dielectric constant of the dielectric substrate 1. It is important that a subtraction of a height in said vertical direction of the first and second discontinuing trench grooves 10b from a thickness of said dielectric substrate 1 is less than a value of $c/\{4f(\in_r-1)^{1/2}\}$, where "c" is the speed of light, "f" is the frequency of signal, and "$\in_r$" is the dielectric constant of the dielectric substrate 1. If the depth or thickness of the first and second discontinuing trench grooves 10b is decreased, then the effect of suppression to the transmission loss is decreased, whilst the effects of improvements in mechanical strength and thermal stress stability of the dielectric substrate is increased. If the depth or thickness of the first and second discontinuing trench grooves 10b is increased, then the effect of suppression to the transmission is increased, whilst the effects of improvements in mechanical strength and thermal stress stability of the dielectric substrate is decreased. Preferable range of the depth or thickness of the first and second discontinuing trench grooves 10a depend upon the frequency of the signal and the dielectric constant of the dielectric substrate 1, for which reason the depth or thickness of the first and second discontinuing trench grooves 10b is preferably decided so that a subtraction of the depth or thickness of the first and second discontinuing trench grooves 10a from the thickness of the dielectric substrate is less than a value of $c/\{4f(\in_r-1)^{1/2}\}$.

As described above, the first and second discontinuing trench grooves 10b are filled with the dielectric material having the lower dielectric constant than the dielectric substrate 1. Further, the first and second discontinuing trench grooves 10b are positioned under inside parts of the top ground conductive layers 3 near the signal conductive line 2, whereby the coupling between the signal waveguide mode and the parallel-plate mode is suppressed.

Further, the dielectric material filling the first and second discontinuing trench grooves 10b is solid-state, for which reason the mechanical strength of the dielectric substrate 1 is improved.

Furthermore, the first and second discontinuing trench grooves 10b do not penetrate the dielectric substrate 1. This means that no penetrating grooves are formed, whereby it is possible to keep a high sealing effect for package in multilayer substrate.

As a modification to the above structure, the bottom portions of the first and second discontinuing trench grooves 10b are separated by the dielectric substrate 1 from the bottom ground conductive layer 4, whilst the top portions of the first and second discontinuing trench grooves 10b are in contact directly with the top ground conductive layers 3 and also in contact directly with the signal conductive layer 2.

As a further modification to the above structure, the bottom portions of the first and second discontinuing trench grooves 10b are separated by the dielectric substrate 1 from the bottom ground conductive layer 4, whilst the top portions of the first and second discontinuing trench grooves 10b are separated by the dielectric substrate 1 from the top ground conductive layers 3 and also from the signal conductive layer 2.

As a still further modification to the above structure, it is possible that in place of the discontinuing trench grooves, alignments of non-penetrating holes filled with the dielectric material having the lower dialectic constant than the dielectric substrate 1. In this case, the effect of increasing in mechanical strength of the dielectric substrate 1 is further improved.

As yet further modification to the above structure, it is possible that the above novel structure may be applied to a slot structure in place of the co-planar structure. In the slot structure, a single first ground conductive layer and a single trench groove are provided. Namely, either left or right part from the signal conductive layer 2 is eliminated in FIGS. 9A, 9B and 9C.

Seventh Embodiment

Figure 10A:
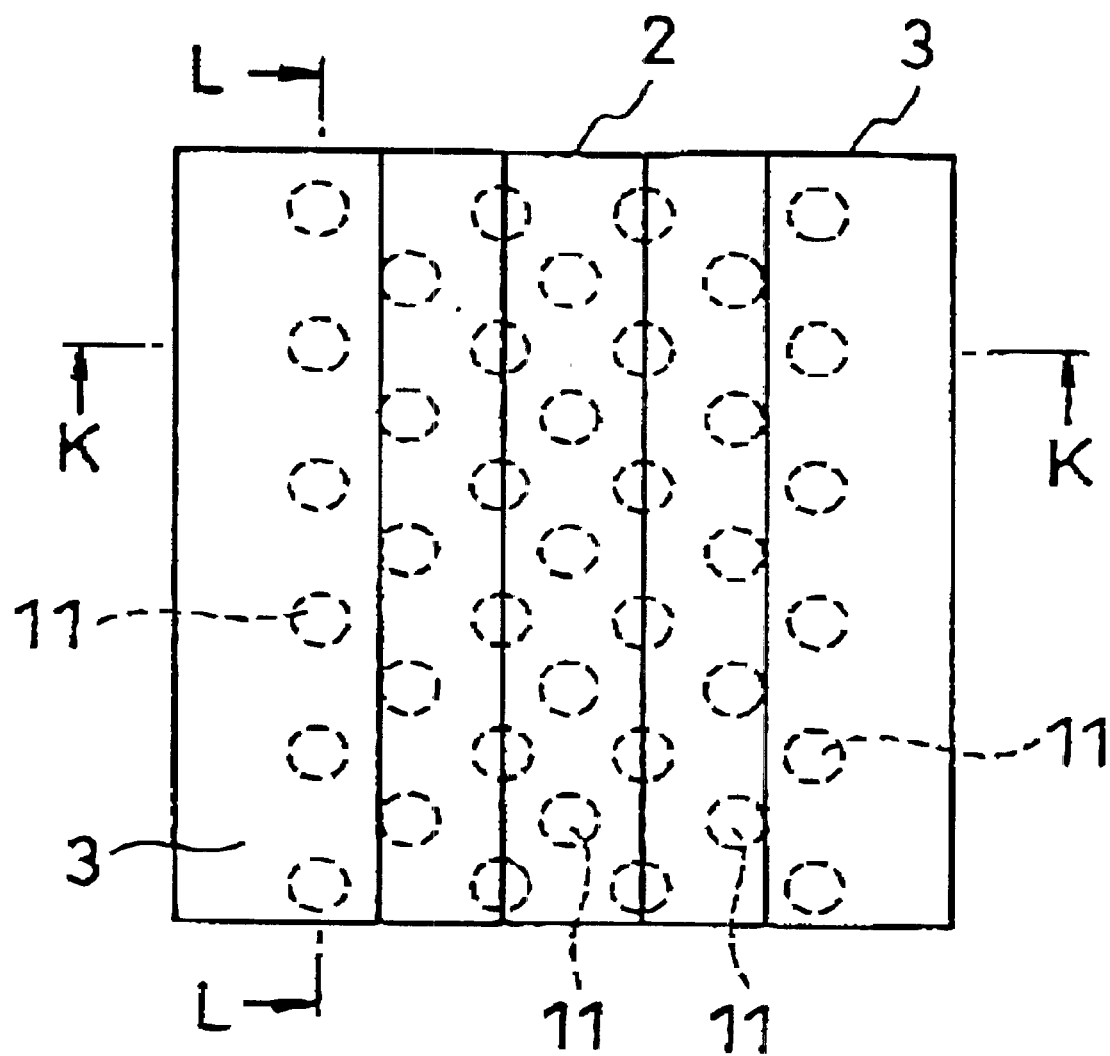
FIG. 10A is a fragmentary plane view illustrative of a novel structure of a co-planer transmission linc in a seventh embodiment in accordance with the present invention.
Figure 10B:
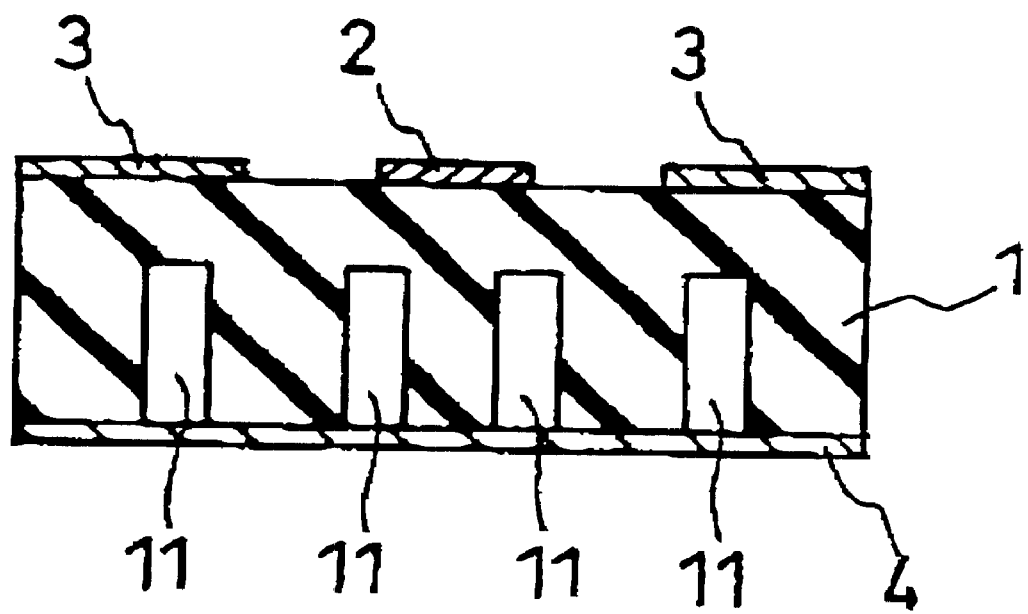
FIG. 10B is a fragmentary cross sectional elevation view taken along a K—K line of FIG. 10A and is illustrative of a novel structure of a co-planer transmission line in a seventh embodiment in accordance with the present invention.
Figure 10C:
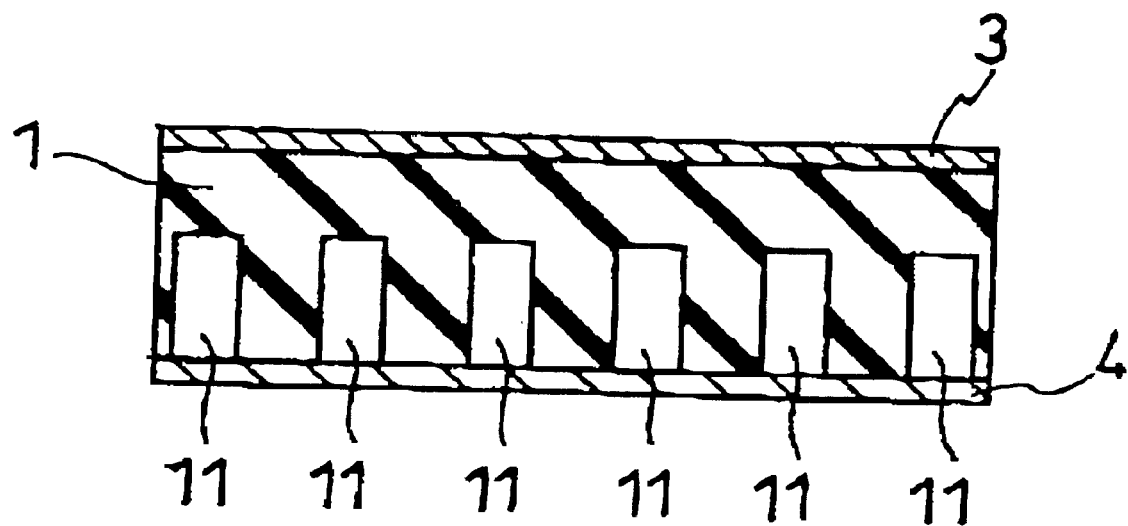
FIG. 10C is a fragmentary cross sectional elevation view taken along an L—L line of FIG. 10A and is illustrative of a novel structure of a co-planer transmission line in a seventh embodiment in accordance with the present invention.

A seventh embodiment according to the present invention will be described in detail with reference to the drawings. FIG. 10A is a fragmentary plane view illustrative of a novel structure of a co-planer transmission line in a seventh embodiment in accordance with the present invention. FIG. 10B is a fragmentary cross sectional elevation view taken along a K—K line of FIG. 10A and is illustrative of a novel structure of a co-planer transmission line in a seventh embodiment in accordance with the present invention. FIG. 10C is a fragmentary cross sectional elevation view taken along an L—L line of FIG. 10A and is illustrative of a novel structure of a co-planer transmission line in a seventh embodiment in accordance with the present invention.

A signal conductive layer 2 as a co-planer transmission line is selectively formed on a top surface of a dielectric substrate 1 which is made of a ceramic. Two ground conductive layers 3 are selectively formed on the top surface of the dielectric substrate 1, so that the ground conductive layers 3 extend in opposite sides of the signal conductive layer 2, provided that the ground conductive layers 3 are distanced from opposite side edges of the signal conductive layer 2. A bottom ground conductive layer 4 is formed entirely on a bottom surface of the dielectric substrate 1. The ground conductive layers 3 and the bottom ground conductive layer 4 are grounded to be substantially fixed at ground potential. A plurality of non-penetrating air-containing holes 11 is distributed in the dielectric substrate 1. The non-penetrating air-containing holes 11 extend in a vertical direction to the top and bottom surfaces of the dielectric substrate 1. The non-penetrating air-containing holes 11 are distributed under the signal conductive layer 2 and also under inside parts of the ground conductive layers 3 near the signal conductive layer 2. The bottom portions of the non-penetrating air-containing holes 11 are in contact directly with the bottom ground conductive layer 4, whilst the top portions of the non-penetrating air-containing holes 11 are separated by the dielectric substrate 1 from the top ground conductive layers 3 and also from the signal conductive layer 2. The non-penetrating air-containing holes 11 have a predetermined uniform top level which is lower than the top ground conductive layers 3 and the signal conductive layer 2. The non-penetrating air-containing holes 11 are aligned in the longitudinal direction of the signal conductive layer 2 at a constant distance between adjacent edges thereof, wherein the constant distance is less than one half of a wavelength of the signal to be transmitted through the signal conductive layer 2, so that the signal wave can sense the non-penetrating air-containing holes 11.

A preferable depth of the non-penetrating air-containing holes 11 depends upon the frequency of the signal and the dielectric constant of the dielectric substrate 1. If the depth of the non-penetrating air-containing holes 11 is decreased, then the effect of suppression to the transmission loss is decreased, whilst the effects of improvements in mechanical strength and thermal stress stability of the dielectric substrate is increased. If the depth of the non-penetrating air-containing holes 11 is increased, then the effect of suppression to the transmission is increased, whilst the effects of improvements in mechanical strength and thermal stress stability of the dielectric substrate is decreased.

As described above, the non-penetrating air-containing holes 11 have the lower dielectric constant than the dielectric substrate 1. Further, the non-penetrating air-containing holes 11 are positioned under the signal conductive line 2 and inside parts of the top ground conductive layers 3 near the signal conductive line 2, whereby the coupling between the signal waveguide mode and the parallel-plate mode is suppressed and further a power leakage mode under the signal conductive line 2 is cut off.

Furthermore, the non-penetrating air-containing holes 11 do not penetrate the dielectric substrate 1. This means that no penetrating grooves are formed, whereby it is possible to keep a high sealing effect for package in multi-layer substrate.

As a modification to the above structure, the bottom portions of the non-penetrating air-containing holes 11 are separated by the dielectric substrate 1 from the bottom ground conductive layer 4, whilst the top portions of the non-penetrating air-containing holes 11 are in contact directly with the top ground conductive layers 3 and also in contact directly with the signal conductive layer 2.

As a further modification to the above structure, the bottom portions of the non-penetrating air-containing holes 11 are separated by the dielectric substrate 1 from the bottom ground conductive layer 4, whilst the to portions of the non-penetrating air-containing holes 11 are separated by the dielectric substrate 1 from the top ground conductive layers 3 and also from the signal conductive layer 2.

As a still further modification to the above structure, it is possible that the above novel structure may be applied to a slot structure in place of the co-planar structure. In the slot structure, a single first ground conductive layer and a single trench groove are provided. Namely, either left or right part from the signal conductive layer 2 is eliminated in FIGS. 10A, 10B and 10C.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A transmission line structure comprising:

a dielectric substrate having first and second surfaces;

a signal conductive layer forming a signal transmission line on said first surface of said dielectric substrate;

at least one first non-signal conductive layer adjacent said transmission line and located on said first surface of said dielectric substrate, said at least one first non-signal conductive layer being electrically separated from said signal conductive layer forming said transmission line by a portion of said first surface;

a second non-signal conductive layer on said second surface of said dielectric substrate, whereby said substrate forms a dielectric layer between said first and second non-signal conductive layers, and a plurality of elongated conductive regions, each having two ends, said regions extending into and through a part of said dielectric layer, one of said two ends of said conductive regions being in contact with a corresponding non-signal layer selected from a group consisting of said at least first non-signal conductive layer and said second non-signal conductive layer, another end of said conductive regions being separated from a remaining and non-selected one of said group of non-signal conductive layers.

2. A transmission line structure comprising:

a dielectric substrate having first and second surfaces;

a signal conductive layer forming a signal transmission line on said first surface of said dielectric substrate;

at least one first non-signal conductive layer adjacent said transmission line and located on said first surface of said dielectric substrate, said at least one first non-signal conductive layer being electrically separated from said signal conductive layer forming said transmission line by a portion of said first surface;

a second non-signal conductive layer on said second surface of said dielectric substrate, whereby said substrate forms a dielectric layer between said first and second non-signal conductive layers, and a plurality of elongated conductive regions, each having two ends, said regions extending into and through a part of said dielectric layer, one of said two ends of said conductive regions being in contact with a corresponding non-signal layer selected from a group consisting of said at least first non-signal conductive layer and said second non-signal conductive layer, another end of said conductive regions being separated from a remaining and non-selected one of said group of non-signal conductive layers, wherein two of said first non-signal conductive layer are provided in opposite sides of said signal conductive line to form a co-planar structure, and at least two of said conductive region extend at least under portions of two of said first non-singal conductive layer near said signal conductive layer.

3. A transmission line structure comprising:

a dielectric substrate having first and second surfaces;

a signal conductive layer forming a signal transmission line on said first surface of said dielectric substrate;

at least one first non-signal conductive layer adjacent said transmission line and located on said first surface of said dielectric substrate, said at least one first non-signal conductive layer being electrically separated from said signal conductive layer forming said transmission line by a portion of said first surface;

a second non-signal conductive layer on said second surface of said dielectric substrate, whereby said substrate forms a dielectric layer between said first and second non-signal conductive layers, and a plurality of elongated conductive regions, each having two ends, said regions extending into and through a part of said dielectric layer, one of said two ends of said conductive regions being in contact with a corresponding non-signal layer selected from a group consisting of said at least first non-signal conductive layer and said second non-signal conductive layer, another end of said conductive regions being separated from a remaining and non-selected one of said group of non-signal conductive layers, wherein said at least conductive region does at least extend under a part of said first non-signal conductive layer near said signal conductive layer, wherein said at least conductive region continuously extends along a direction of signal propagation through said signal conductive layer.

4. A transmission line structure comprising:

a dielectric substrate having first and second surfaces;

a signal conductive layer forming a signal transmission line on said first surface of said dielectric substrate;

at least one first non-signal conductive layer adjacent said transmission line and located on said first surface of said dielectric substrate, said at least one first non-signal conductive layer being electrically separated from said signal conductive layer forming said transmission line by a portion of said first surface;

a second non-signal conductive layer on said second surface of said dielectric substrate, whereby said substrate forms a dielectric layer between said first and second non-signal conductive layers, and a plurality of elongated conductive regions, each having two ends, said regions extending into and through a part of said dielectric layer, one of said two ends of said conductive regions being in contact with a corresponding non-signal layer selected from a group consisting of said at least first non-signal conductive layer and said second non-signal conductive layer, another end of said conductive regions being separated from a remaining and non-selected one of said group of non-signal conductive layers, wherein said at least conductive region continuously extends along a direction of signal propagation through said signal conductive layer, wherein said at least conductive region discontinuously extends along a direction of signal propagation through said signal conductive layer.

5. A transmission line structure comprising:

a dielectric substrate having first and second surfaces;

a signal conductive layer forming a signal transmission line on said first surface of said dielectric substrate;

at least one first non-signal conductive layer adjacent said transmission line and located on said first surface of said dielectric substrate, said at least one first non-signal conductive layer being electrically separated from said signal conductive layer forming said transmission line by a portion of said first surface;

a second non-signal conductive layer on said second surface of said dielectric substrate, whereby said substrate forms a dielectric layer between said first and second non-signal conductive layers, and a plurality of elongated conductive regions, each having two ends, said regions extending into and through a part of said dielectric layer, one of said two ends of said conductive regions being in contact with a corresponding non-signal layer selected from a group consisting of said at least first non-signal conductive layer and said second non-signal conductive layer, another end of said conductive regions being separated from a remaining and non-selected one of said group of non-signal conductive layers, wherein said at least conductive region discontinuously extends along a direction of signal propagation through said signal conductive layer.

6. The transmission line structure as claimed in claim 5, wherein a distance of discontinuation of said at least conductive region in said direction of signal propagation is not more than one half of a wavelength of signal to be transmitted through said signal conductive line.

7. The transmission line structure as claimed in claim 6, wherein said at least conductive region comprises at least an alignment of a plurality of conductive via.

8. The transmission line structure as claimed in claim 7, wherein each of said conductive via has a pin-shape.

9. The transmission line structure as claimed in claim 7, wherein said at least conductive region comprises a single alignment of a plurality of conductive via which is in contact with said first non-signal conductive layer, and which is separated by said dielectric substrate from said second non-signal conductive layer.

10. The transmission line structure as claimed in claim 1, wherein said at least conductive region has a size in said vertical direction in a range of $1/5$ to $3/5$ of a thickness of said dielectric substrate.

11. The transmission line structure as claimed in claim 10, wherein said size is in a range of $1/2$ to $3/5$ of a thickness of said dielectric substrate.

12. A transmission line structure comprising:

a dielectric substrate having first and second surfaces;

a signal conductive layer forming a signal transmission line on said first surface of said dielectric substrate;

at least one first non-signal conductive layer adjacent said transmission line and located on said first surface of said dielectric substrate, said at least one first non-signal conductive layer being electrically separated from said signal conductive layer forming said transmission line by a portion of said first surface;

a second non-signal conductive layer on said second surface of said dielectric substrate, whereby said substrate forms a dielectric layer between said first and second non-signal conductive layers, and a plurality of elongated conductive regions, each having two ends, said regions extending into and through a part of said dielectric layer, one of said two ends of said conductive regions being in contact with a corresponding non-signal layer selected from a group consisting of said at least first non-signal conductive layer and said second non-signal conductive layer, another end of said conductive regions being separated from a remaining and non-selected one of said group of non-signal conductive layers, wherein one of said first non-signal conductive layer is provided to form a slot structure, and said conductive region does at least extend under said first non-signal conductive layer near said signal conductive layer.

13. A transmission line structure comprising:

a dielectric substrate having first and second surfaces;

a signal conductive layer forming a signal transmission line on said first surface of said dielectric substrate;

at least one first non-signal conductive layer adjacent said transmission line and located on said first surface of said dielectric substrate, said at least one first non-signal conductive layer being electrically separated from said signal conductive layer forming said transmission line by a portion of said first surface;

a second non-signal conductive layer on said second surface of said dielectric substrate, whereby said substrate forms a dielectric layer between said first and second non-signal conductive layers, and a plurality of elongated conductive regions, each having two ends, said regions extending into and through a part of said dielectric layer, one of said two ends of said conductive regions being in contact with a corresponding non-signal layer selected from a group consisting of said at least first non-signal conductive layer and said second non-signal conductive layer, another end of said conductive regions being separated from a remaining and non-selected one of said group of non-signal conductive layers, further comprising at least a low dielectric constant region which is lower in dielectric constant than said dielectric substrate, and said low dielectric via are connected through an interlayer conductive layer.

* * * * *